(12) United States Patent
Van De Ven et al.

(10) Patent No.: US 12,235,592 B2
(45) Date of Patent: Feb. 25, 2025

(54) OBJECT HOLDER, ELECTROSTATIC SHEET AND METHOD FOR MAKING AN ELECTROSTATIC SHEET

(71) Applicants: ASML NETHERLANDS B.V., Veldhoven (NL); ASML HOLDING N.V., Veldhoven (NL)

(72) Inventors: Bastiaan Lambertus Wilhelmus Marinus Van De Ven, Rosmalen (NL); Koos Van Berkel, Waalre (NL); Marcus Adrianus Van De Kerkhof, Helmond (NL); Roger Franciscus Mattheus Maria Hamelinck, Breda (NL); Shahab Shervin, Norwalk, CT (US); Marinus Augustinus Christiaan Verschuren, Helmond (NL); Johannes Bernardus Charles Engelen, 'S-Hertogenbosch (NL); Matthias Kruizinga, Herten (NL); Tammo Uitterdijk, Wilton, CT (US); Oleksiy Sergiyovich Galaktionov, Geldrop (NL); Kjeld Gertrudus Hendrikus Janssen, Nijmegen (NL); Johannes Adrianus Cornelis Maria Pijnenburg, Moergestel (NL); Peter Van Delft, Geldrop (NL)

(73) Assignee: ASML NETHERLANDS B.V., Veldhoven (NL)

( * ) Notice: Subject to any disclaimer, the term of this patent is extended or adjusted under 35 U.S.C. 154(b) by 140 days.

(21) Appl. No.: 18/008,283

(22) PCT Filed: Jun. 9, 2021

(86) PCT No.: PCT/EP2021/065418
§ 371 (c)(1),
(2) Date: Dec. 5, 2022

(87) PCT Pub. No.: WO2021/250074
PCT Pub. Date: Dec. 16, 2021

(65) Prior Publication Data
US 2023/0236518 A1    Jul. 27, 2023

(30) Foreign Application Priority Data
Jun. 11, 2020   (EP) ..................... 20179524

(51) Int. Cl.
*G03F 7/00*   (2006.01)
(52) U.S. Cl.
CPC ...... *G03F 7/70825* (2013.01); *G03F 7/70708* (2013.01)
(58) Field of Classification Search
CPC ............ G03F 7/70708; G03F 7/70825; H01L 21/6833; H01L 21/6875
See application file for complete search history.

(56) References Cited

U.S. PATENT DOCUMENTS 8,476,167 B2   7/2013  Van Mierlo et al.
2009/0168292 A1  7/2009  Watanabe et al.
(Continued)

FOREIGN PATENT DOCUMENTS

EP           2 208 224 B1   11/2019
WO    WO 2012/005294 A1    1/2012
(Continued)

OTHER PUBLICATIONS

International Preliminary Report on Patentability directed to International Patent Application No. PCT/EP2021/065418, issued Dec. 13, 2022; 9 pages.
(Continued)

*Primary Examiner* — Peter B Kim
(74) *Attorney, Agent, or Firm* — Sterne, Kessler, Goldstein & Fox P.L.L.C.

(57) ABSTRACT

An object holder configured to support an object, the object holder comprising: a core body comprising a plurality of burls having distal ends in a support plane for supporting the object; an electrostatic sheet between the burls, the electro-
(Continued)

static sheet comprising an electrode sandwiched between dielectric layers; and a circumferential barrier for reducing outflow of gas escaping from space between the object and the core body.

14 Claims, 12 Drawing Sheets

(56) References Cited

U.S. PATENT DOCUMENTS

| | | | |
|---|---|---|---|
| 2011/0222033 A1 | 9/2011 | Ten Kate et al. | |
| 2012/0274920 A1 | 11/2012 | Bex et al. | |
| 2013/0094009 A1 | 4/2013 | Lafarre et al. | |
| 2016/0018744 A1* | 1/2016 | Lafarre | G03F 7/70716 156/60 |
| 2020/0321233 A1* | 10/2020 | Ziegenhagen | G03F 7/70708 |

FOREIGN PATENT DOCUMENTS

| WO | 2014/154428 A2 | 10/2014 |
|---|---|---|
| WO | WO 2015/120923 A1 | 8/2015 |

OTHER PUBLICATIONS

International Search Report and Written Opinion of the International Searching Authority directed to related International Patent Application No. PCT/EP2021/065418, mailed Aug. 9, 2021; 12 pages.

* cited by examiner

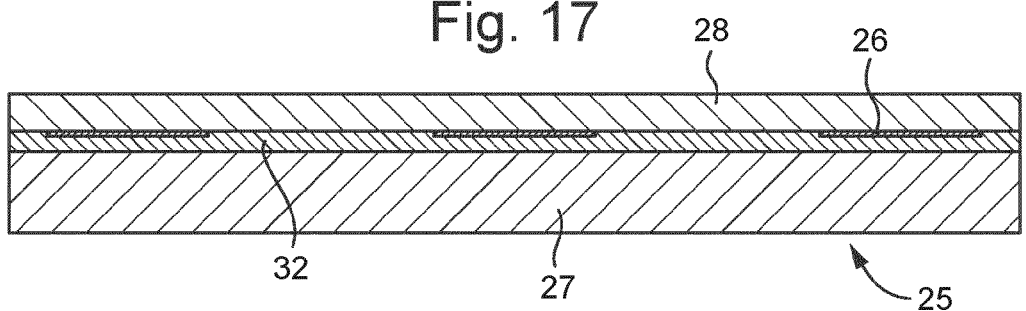
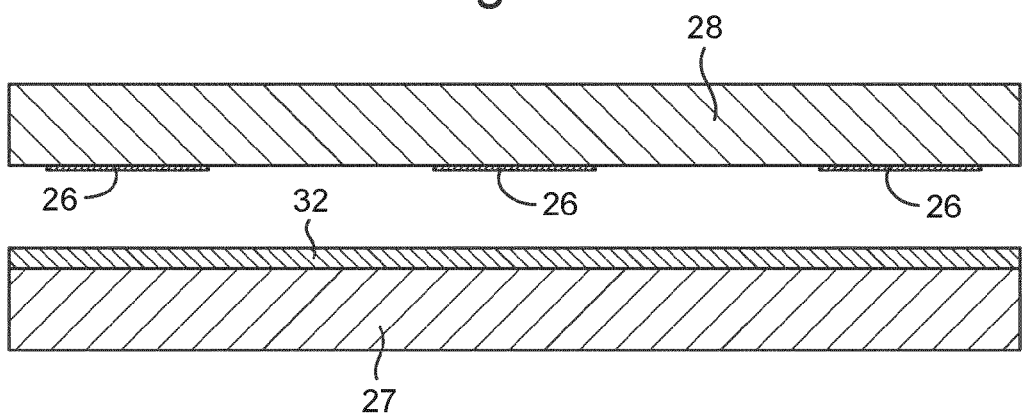
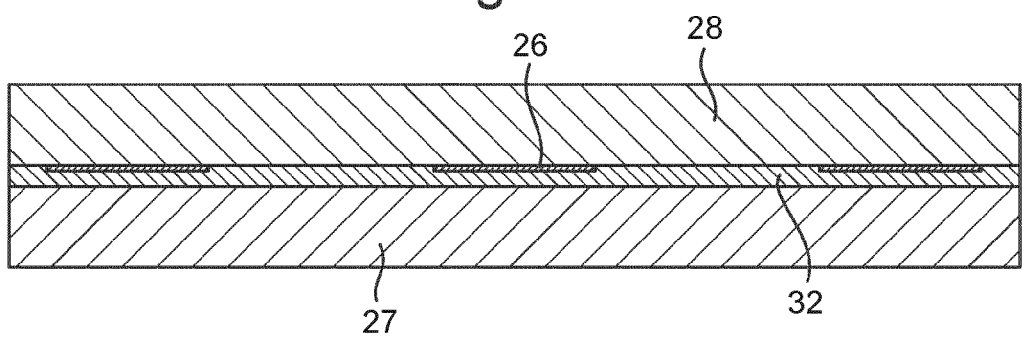

OBJECT HOLDER, ELECTROSTATIC SHEET AND METHOD FOR MAKING AN ELECTROSTATIC SHEET

CROSS-REFERENCE TO RELATED APPLICATIONS

This application claims priority of EP application 20179524.2 which was filed on 11 Jun. 2020, and which is incorporated herein in its entirety by reference.

FIELD

The present invention relates to an object holder for use in a lithographic apparatus. More particularly, the object holder comprises an electrostatic clamp arranged to clamp the object holder to a table and/or to clamp an object to the object holder. The present invention further relates to an electrostatic sheet and to a method for making an electrostatic sheet.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask or reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In a conventional lithography apparatus, the substrate to be exposed may be supported by a substrate holder (i.e. the object that directly supports a substrate) which in turn is supported by a substrate table (mirror block or stage, i.e. the object such as table that supports the substrate holder and provides the upper surface surrounding the substrate holder). The substrate holder is often a flat rigid disc corresponding in size and shape to the substrate (although it may have a different size or shape). It has an array of projections, referred to as burls or pimples, projecting from at least one side. The substrate holder may have an array of projections on two opposite sides. In this case, when the substrate holder is placed on the substrate table, the main body of the substrate holder is held a small distance above the substrate table while the ends of the burls on one side of the substrate holder lie on the surface of the substrate table. Similarly, when the substrate rests on the top of the burls on the opposite side of the substrate holder, the substrate is spaced apart from the main body of the substrate holder. The purpose of this is to help prevent a particle (i.e. a contaminating particle such as a dust particle) which might be present on either the substrate table or substrate holder from distorting the substrate holder or substrate. Since the total surface area of the burls is only a small fraction of the total area of the substrate or substrate holder, it is highly probable that any particle will lie between burls and its presence will have no effect. Often, the substrate holder and substrate are accommodated within a recess in the substrate table so that the upper surface of the substrate is substantially coplanar with the upper surface of the substrate table.

Due to the high accelerations experienced by the substrate in use of a high-throughput lithographic apparatus, it is not sufficient to allow the substrate simply to rest on the burls of the substrate holder. It is clamped in place. Two methods of clamping the substrate in place are known—vacuum clamping and electrostatic clamping. In vacuum clamping, the space between the substrate holder and substrate and optionally between the substrate table and substrate holder are partially evacuated so that the substrate is held in place by the higher pressure of gas or liquid above it. Vacuum clamping however may not be used where the beam path and/or the environment near the substrate or substrate holder is kept at a low or very low pressure, e.g. for extreme ultraviolet (EUV) radiation lithography. In this case, it may not be possible to develop a sufficiently large pressure difference across the substrate (or substrate holder) to clamp it. Electrostatic clamping may therefore be used. In electrostatic clamping, a potential difference is established between the substrate, or an electrode plated on its lower surface, and an electrode provided on, or in, the substrate table and/or substrate holder. The two electrodes behave as a large capacitor and substantial clamping force can be generated with a reasonable potential difference. An electrostatic arrangement can be such that a single pair of electrodes, one on the substrate table and one on the substrate, clamps together the complete stack of substrate table, substrate holder and substrate. In a known arrangement, one or more electrodes may be provided on, or in, the substrate holder so that the substrate holder is clamped to the substrate table and the substrate is separately clamped to the substrate holder.

There is a need to improve substrate holders that comprise one or more electrostatic clamps for clamping a substrate holder to a substrate table and/or a substrate to a substrate holder. More generally, there is a need to improve an object holder, such as patterning device holder, that comprises one or more electrostatic clamps for holding the object holder to a table and/or holding an object against the object holder.

SUMMARY

According to a first aspect of the invention, there is provided an object holder configured to support an object, the object holder comprising: a core body comprising a plurality of burls having distal ends in a support plane for supporting the object; an electrostatic sheet between the burls, the electrostatic sheet comprising an electrode sandwiched between dielectric layers; and a circumferential barrier for reducing outflow of gas escaping from a space between the electrostatic sheet and the core body.

According to a second aspect of the invention, there is provided an electrostatic sheet for an object holder configured to support an object, the electrostatic sheet comprising: holes for accommodating burls of a core body for supporting the object; dielectric layers; and an electrode sandwiched between dielectric layers; wherein the electrostatic sheet further comprises a circumferential barrier for reducing outflow of gas escaping from a space between the electrostatic sheet and the core body.

According to a third aspect of the invention, there is provided a method for making an electrostatic sheet for an object holder configured to support an object, the method comprising: applying an electrode to a dielectric layer; and bonding the dielectric layer to another dielectric layer so as to sandwich the electrode between the dielectric layers; wherein the electrostatic sheet comprises a circumferential barrier for reducing outflow of gas escaping from a space between the electrostatic sheet and the object.

BRIEF DESCRIPTION OF THE DRAWINGS

Embodiments of the invention will now be described, by way of example only, with reference to the accompanying schematic drawings, in which:

FIG. 17 is a cross-sectional view of an electrostatic sheet according to an embodiment of the invention;

FIGS. 18 and 19 show different stages of a method of making the electrostatic sheet shown in FIG. 17;

Figure 1:
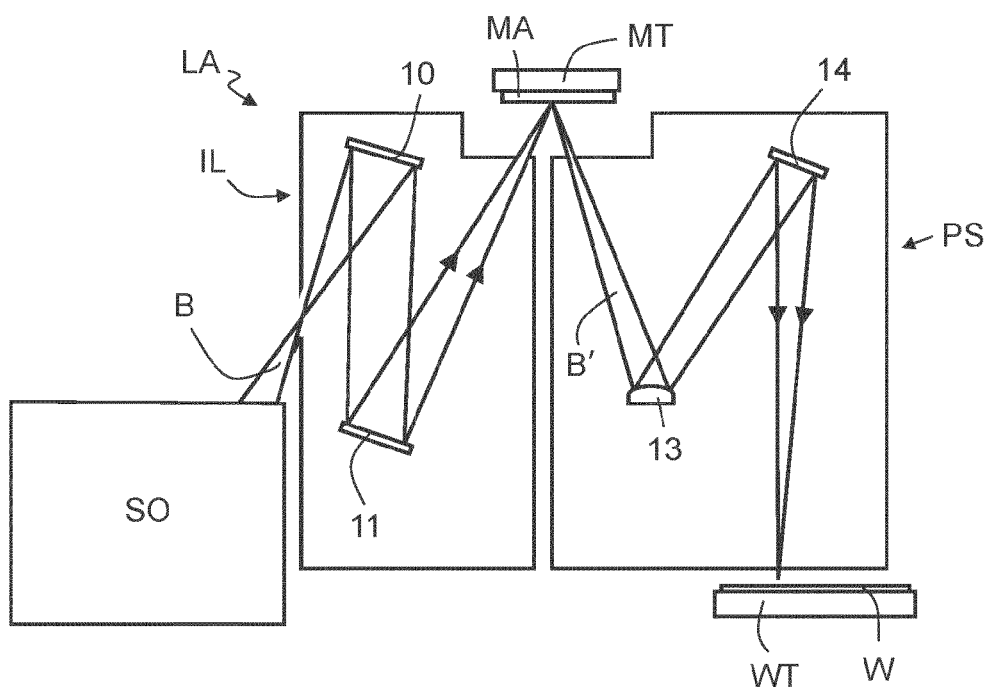
FIG. 1 depicts a lithographic system comprising a lithographic apparatus and a radiation source.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask or reticle), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

Figure 2:
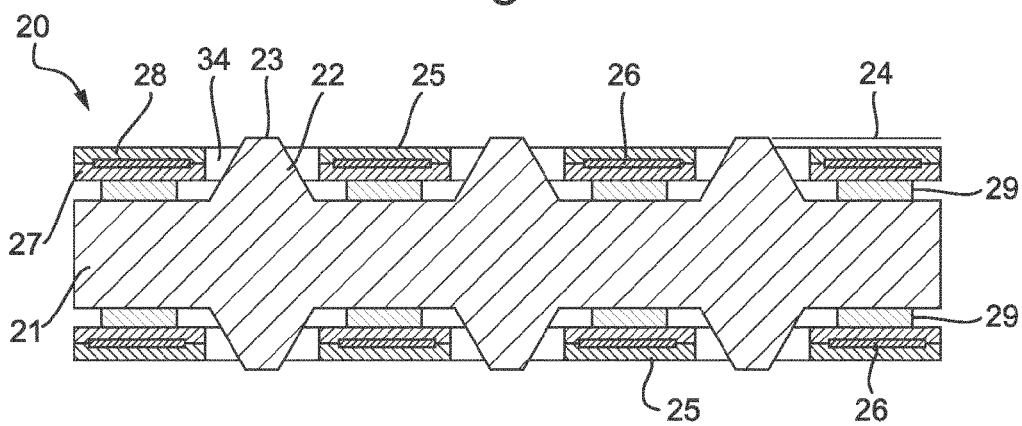
FIG. 2 is a cross-sectional view of an object holder according to an embodiment of the invention.

FIG. 2 is a cross-sectional view of an object holder 20 according to an embodiment of the invention. The object holder 20 is configured to support an object. In the description below, the invention will be described in a context of the object holder being a substrate holder 20 that is configured to support a substrate W. However, the object holder is not limited to such a substrate holder 20. For example, the object holder may be configured to support a patterning device MA.

In an embodiment, the substrate table WT comprises the substrate holder 20 and a substrate stage. The substrate stage comprises a recess into which the substrate holder 20 is held. The substrate holder 20 is configured to hold the substrate W relative to the substrate stage of the substrate table WT.

As shown in FIG. 2, in an embodiment the substrate holder 20 comprises a core body 21. The core body 21 is a plate-like disk. As shown in FIG. 2, in an embodiment the core body 21 comprises a plurality of burls 22. The burls 22 are protrusions protruding at the surface of the core body 21. As shown in FIG. 2, in an embodiment the burls 22 have distal ends 23. The core body 21 is configured such that the distal ends 23 are in a support plane 24 for supporting the substrate W. The underside of the substrate W comes into contact with the distal ends 23 of the burls 22. The position of the underside of the substrate W corresponds to the support plane 24. The burls 22 are arranged so that the substrate W lies generally flat on the substrate holder 20.

The burls 22 are not shown to scale in FIG. 2. In a practical embodiment, there can be many hundreds, thousands, or tens of thousands, of burls distributed across a substrate holder 20 of diameter, e.g., 200 mm, 300 mm or 450 mm. The tips of the burls 22 have a small area, e.g. less than 1 mm2, so that the total area of all of the burls 22 on one side of the substrate holder 20 is less than about 10% of the total area of the total surface area of the substrate holder 20. Because of the arrangement of burls 22, there is a high probability that any particle that might lie on the surface of the substrate W, substrate holder 20 or substrate table WT will fall between burls 22 and will not therefore result in a deformation of the substrate W or substrate holder 20. The burl arrangement, which may form a pattern, can be regular or can vary as desired to provide appropriate distribution of force on the substrate W and substrate table WT. The burls 22 can have any shape in plan but are commonly circular in plan. The burls 22 can have the same shape and dimensions throughout their height but are commonly tapered. The burls 22 can project a distance of from about 1 μm to about 5 mm, desirably from about 5 μm to about 250 μm, desirably about 10 μm above the rest of the object-facing surface of the substrate holder 20 (i.e. the top surface of the electrostatic sheet 25). Hence, the distance between the distal ends 23 of the burls 22 and the top surface of the electrostatic sheet 25 in the vertical direction is from about 1 μm to about 5 mm, desirably from about 5 μm to about 250 μm, desirably about 10 μm. The thickness of the core body 21 of the substrate holder 20 can be in the range of about 1 mm to about 50 mm, desirably in the range of about 5 mm to 20 mm, typically 10 mm.

The core body 21 may be made of rigid material. Desirably the material has a high thermal conductivity and a coefficient of thermal expansion that is close to that of the object held. Desirably the material is electrically conductive. Desirably the material has a high hardness. A suitable material includes SiC (silicon carbide), SiSiC (siliconized silicon carbide), Si3N4(silicon nitrite), quartz, and/or various other ceramic and glass-ceramics, such as Zerodur™ glass ceramic. The core body 21 can be manufactured by selectively removing material from a solid disc of the relevant material so as to leave the projecting burls 22. A suitable technique to remove material includes electrical discharge machining (EDM), etching, machining and/or laser ablation. The core body 21 can also be manufactured by growing burls 22 through a mask. The burls 22 may be of the same material as the base and can be grown by a physical vapor deposition process or sputtering. In an embodiment, the core body 21 comprises one or more internal channels (not shown in the Figures). In an embodiment, the core body 21 comprises a plurality of layers that are bonded together. In an embodiment, the layers are formed of different materials. Merely as one example, in an embodiment the core body 21 comprises a layer of SiSiC, a layer of glass and another layer of SiSiC in that order. Other combinations of layers are also possible.

As shown in FIG. 2, in an embodiment the substrate holder 20 comprises one or more electrodes 26 for an electrostatic clamp. A potential difference may be generated in order to provide an electrostatic clamping force between the substrate W and the substrate holder 20 and/or between the substrate holder 20 and the substrate stage of the substrate table WT. In an embodiment, the electrodes 26 are encapsulated between dielectric layers (also known as electrical isolation layers) 27, 28. The potential difference generated may be of the order of 10 to 5,000 volts. Arrangements using one or more heaters and temperature sensors to locally control the temperature of a substrate are described in U.S. publication no. 2011-0222033, which is incorporated herein by reference in its entirety and the techniques therein may be applied to the techniques herein.

As shown in FIG. 2, in an embodiment the substrate holder 20 comprises an electrostatic sheet 25. The electrostatic sheet 25 comprises one or more electrodes 26. For the electrodes 26, in an embodiment two halves of continuous metal film (but isolated from the distal ends 23 of the burls 22) may be separated by a separation distance from each other and deposited to form positive and negative elements of the electrostatic clamp. The separation distance is not particularly limited. In an embodiment the separation distance is at least about 20 μm, optionally at least about 50 μm, optionally at least about 100 μm, optionally at least about 200 μm, and optionally at least about 500 μm. In an embodiment the separation distance is at most about 2 mm, optionally at most about 1 mm, and optionally at most about 500 μm. In an embodiment the separation distance is about 500 μm. There may therefore be two electrodes 26. However, the number of electrodes 26 in the electrostatic sheet 25 is not particularly limited and may be one or three or more. Metal lines of the electrodes 26 may have a layer thickness greater than about 20 nm, desirably greater than about 40 nm. The metal lines desirably have a layer thickness less than or equal to about 1 μm, desirably less than about 500 nm, desirably less than about 200 nm.

An electrode 26 of an upper electrostatic sheet 25 may be configured to electrostatically clamp the substrate W to the substrate holder 20. An electrode 26 of a lower electrostatic sheet 25 may be configured to electrostatically clamp the substrate holder 20 to the rest of the substrate table WT.

In an embodiment the material of the core body 21 and the burls 22 is electrically conductive. For example, in an embodiment the material of the burls 22 is SiSiC. However, it is not essential for the material of the core body 21 and the burls 22 to be electrically conductive. In an embodiment, a grounding layer may be provided that electrically connects the distal ends 23 of two or more of the burls 22 (optionally all of the burls 22) to ground or a common electrical potential. The grounding layer may be formed by depositing a relatively thick layer of a conductive material. The conductive material is not particularly limited. In an embodiment the conductive material is Cr. In an alternative embodiment the conductive material is CrN. In an embodiment the deposited layer is then patterned to form the grounding layer. The pattern may comprise a series of metal lines that connect together distal ends 23 of the burls 22. Such patterns are sometimes referred to as "Manhattan" patterns. In an alternative embodiment the deposited layer is not patterned. In an embodiment the grounding layer or another layer is arranged to cover a surface of the core body 21 and/or the burls 22. The grounding layer or other layer can help to smoothen the surface to make it easier to clean the surface.

As shown in FIG. 2, in an embodiment the electrostatic sheet 25 comprises an electrode 26 sandwiched between dielectric layers 27, 28. As shown in FIG. 2, in an embodiment burls 22 and the electrostatic sheet 25 are provided on both main surfaces of the substrate holder 20. In an alternative embodiment, the burls 22 and the electrostatic sheet 25 are provided on only one of the two main surfaces of the substrate holder 20. As shown in FIG. 2, in an embodiment the electrostatic sheet 25 is between the burls 22. For example, as shown in FIG. 2, holes 34 are provided in the electrostatic sheet 25. The holes 34 are arranged such that their position corresponds to the burls 22 of the core body 21. The burls 22 protrude through respective holes 34 of the electrostatic sheet 25 such that the electrode 26 that is sandwiched between the dielectric layers 27, 28 is provided in the region between the burls 22.

As shown in FIG. 2, in an embodiment the substrate holder 20, comprises a bonding material 29. In an embodiment, the bonding material has a thickness of at least 100 nm, for example about 50 μm. The bonding material 29 secures the position of the electrostatic sheet 25 relative to the core body 21. The bonding material 29 keeps the holes 34 in the electrostatic sheet 25 aligned with the burls 22. In an embodiment, the burls 22 are positioned at the centre of respective holes 34 of the electrostatic sheet 25.

As shown in FIG. 2, in an embodiment the bonding material 29 is formed in discrete portions that do not connect to each other. There may be some variation in the thickness of the different portions of bonding material 29. In an embodiment, the separate portions of bonding material 29 have substantially the same thickness as each other.

Figure 3A:
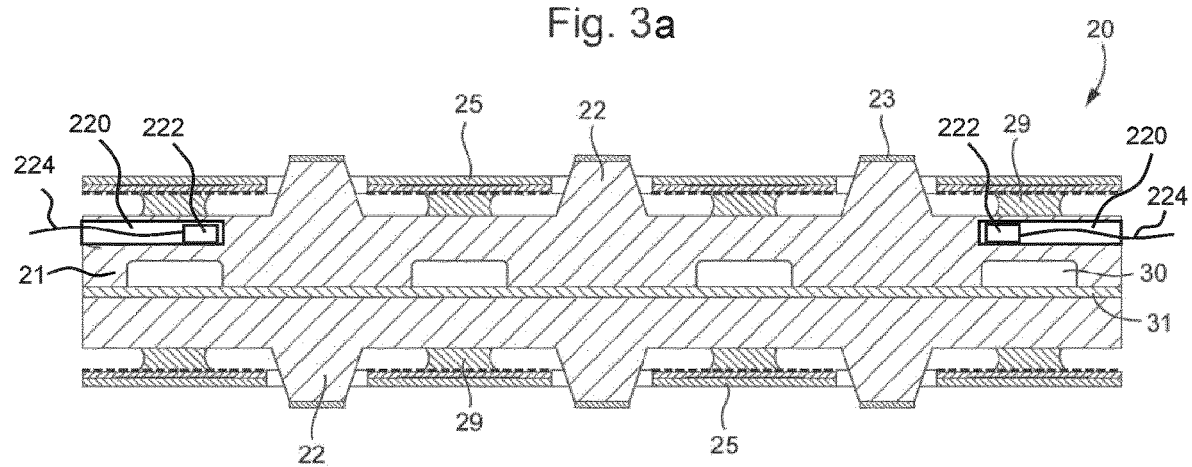
FIGS. 3a and 3b are a cross-sectional view of an object holder according to an embodiment of the invention.

FIG. 3a is a cross-sectional view of a substrate holder 20 according to an embodiment of the invention. For conciseness, features shown in FIG. 3a that are common to the arrangement shown in FIG. 2 will not be described below. Instead, the description below focusses on features that are shown in FIG. 3a that are not shown in FIG. 2.

Figure 6:
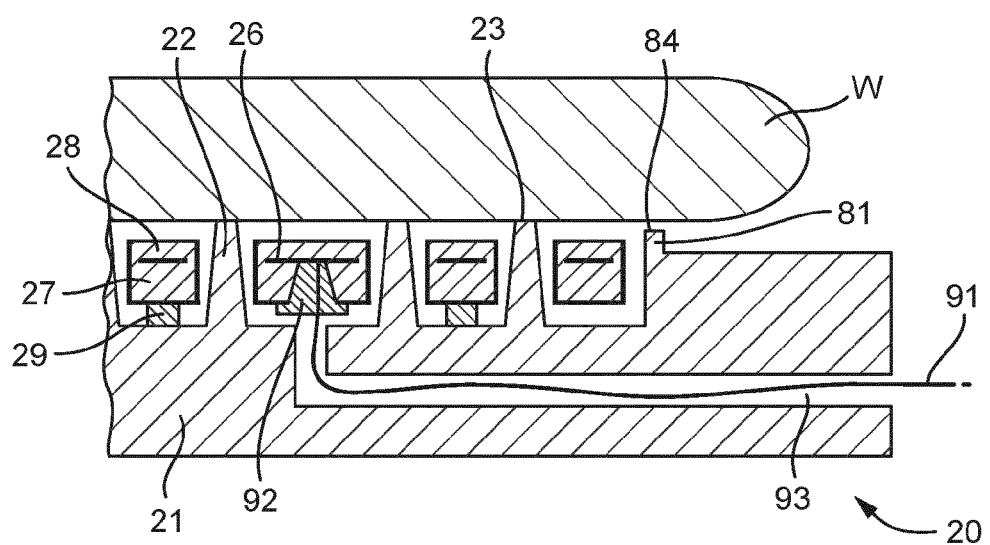

As shown in FIG. 3a, in an embodiment the substrate holder 20 comprises a thermal conditioner. The thermal conditioner is configured to thermally condition the core body 21 and/or the electrostatic sheet 25 and/or the substrate W. The thermal conditioner can be used to control the temperature of the substrate W, for example, during an exposure process. As shown in FIG. 3a, in an embodiment the thermal conditioner comprises a circuit 30 through which thermal conditioning fluid flows. The thermal conditioning fluid may be a gas or a liquid (e.g. water). In an embodiment the circuit 30 comprises one or more channels connected to each other. As shown in FIG. 6, in an embodiment the channels of the circuit 30 are provided within the core body 21. In an embodiment the thermal conditioner comprises heaters and sensors controlled to control the thermal conditioning function.

As shown in FIG. 3a, in an embodiment the core body 21 is manufactured in two pieces which are then attached to each other at a bond 31. The channels of the circuit 30 can be formed in one of the two pieces of the core body 21. The circuit 30 is enclosed by the other piece of the core body 21.

Manufacturing the core body in two pieces makes it easier to manufacture the core body 21.

As shown in FIG. 3a, in an embodiment, the distal ends 23 of the burls 22 are provided with a coating. In an embodiment, the coating at the distal ends 23 is configured to resist corrosion and wear, and to provide a desired coefficient of friction with the substrate W. In an embodiment, the coating comprises chromium nitride. In an embodiment, the coating comprises diamond-like carbon (DLC).

In an embodiment, the coating comprises a layer of chromium nitride on a layer of diamond-like carbon (DLC). Other materials can also be used as a coating at the distal ends 23 of the burls 22.

As shown in FIG. 3a, in an embodiment, the substrate holder 20 comprises a plurality of temperature sensors 222. The temperature sensors 222 may measure a temperature distribution in the substrate holder 20. As EUV light heats up the wafer and may also heat up the substrate holder 20, deforming both the wafer and the substrate holder 20, resulting in overlay errors. By knowing the (3D) temperature distribution across the substrate holder 20, the exposure parameters may be changed so that overlay errors may be reduced. The temperature sensors 222 may be located at the core body 21 or/and at the electrostatic sheet 25. The temperature sensors 222 may be negative temperature coefficient sensors (in the order of 1 mm long). The temperature sensors 222 may be spatially distributed in the substrate holder 20. The temperature sensors 222 may be located closer to the object-facing surface of the substrate holder 20 than to the circuit 30. The temperature sensors 222 may be located radially or axially relative to the substrate holder 20.

As shown in FIG. 3a, in an embodiment, the temperature sensors 222 are placed in holes 220 with a radial opening. The holes 220 are located between the circuit 30 and the electrostatic sheet 25 at the perimeter of the core body 27. Wiring 224 is connected to the temperature sensors 222.

Figure 3B:
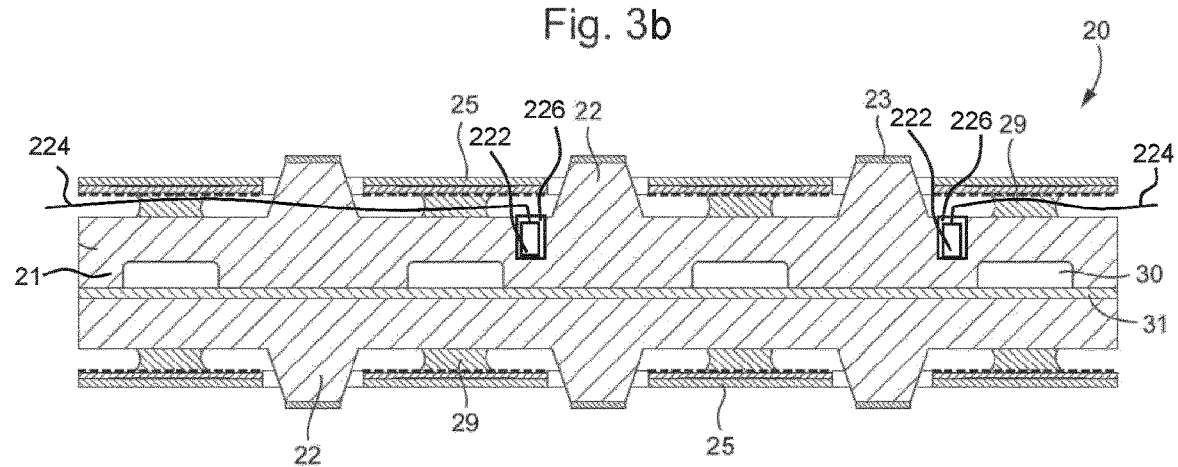

FIG. 3b is a cross-sectional view of a substrate holder 20 according to an embodiment of the invention. For conciseness, features shown in FIG. 3b that are common to the arrangement shown in FIG. 3a will not be described below. Instead, the description below focusses on features that are shown in FIG. 3b that are not shown in FIG. 3a. As shown in FIG. 3b, the temperature sensors 222 are placed in holes 226 with an axial opening. The holes 226 are located between the circuit 30 and the electrostatic sheet 25. Wiring 224 is connected to the temperature sensors 222. Compared to the sensor configuration in FIG. 3a, the sensor configuration in FIG. 3b has more freedom as the temperature sensors 222 may be placed in a larger area.

Figure 4:
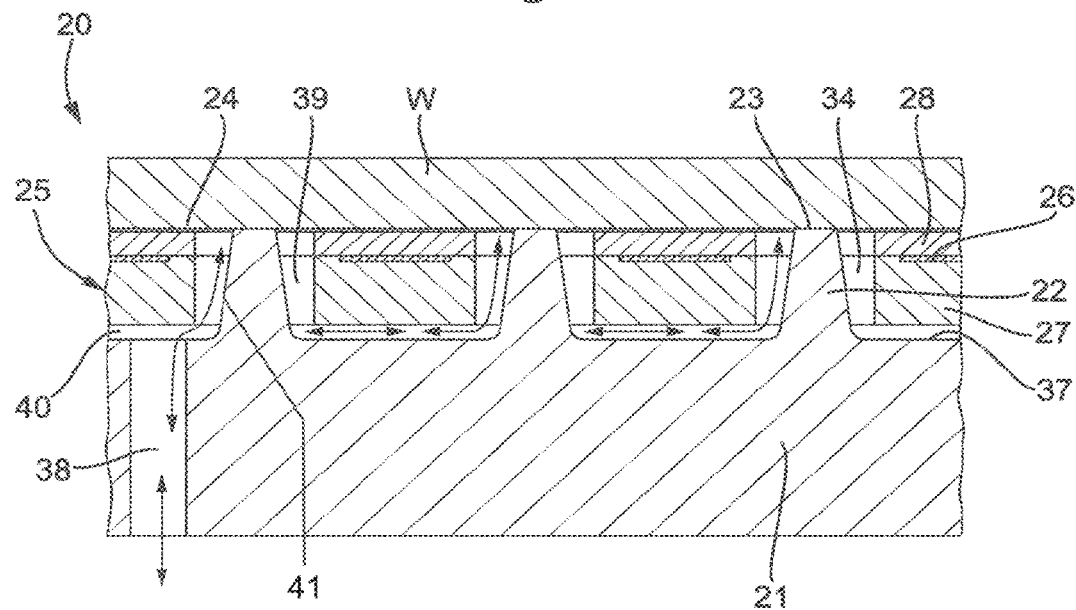
FIG. 4 is a close-up view of part of an object holder according to an embodiment of the invention.
Figure 8:
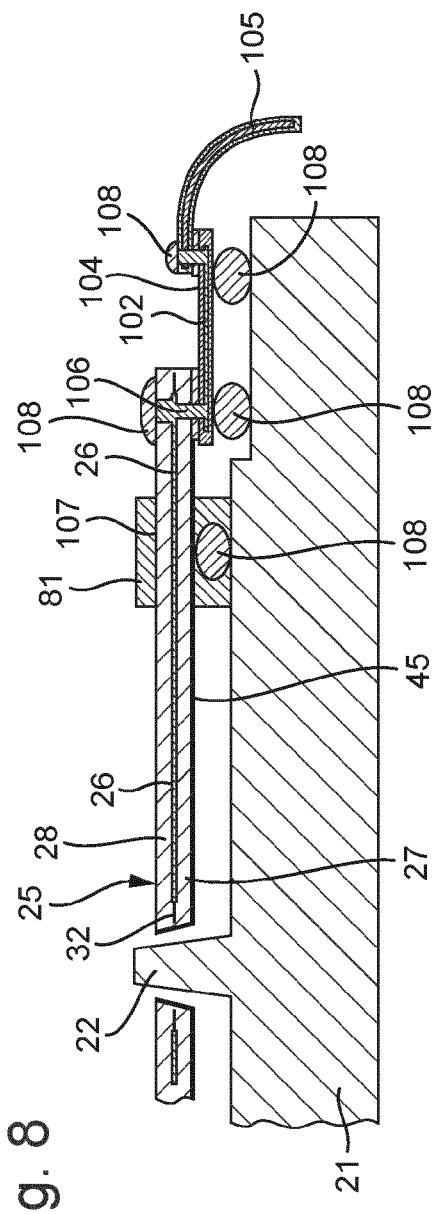
FIG. 8 is an alternative view of the object holder shown in FIG. 7.

FIG. 4 is a close-up view of part of a substrate holder 20 according to an embodiment of the invention. As shown in FIG. 4, in an embodiment the core body 21 comprises at least one gas supply passageway 38. The gas supply passageway 38 is configured to supply gas to the radial gap 39 between the radially outer surface 41 of at least one of the burls 22 and the electrostatic sheet 25 via a vertical gap 40 between the core body 21 and the electrostatic sheet 25. In FIG. 8, the double ended arrows represent flow of gas.

As mentioned above and shown in FIG. 3a, in an embodiment, the substrate holder 20 comprises a thermal conditioner configured to thermally condition the substrate W. By providing the gas supply passageway 38, gas can be supplied between the substrate W and the substrate holder 20 so as to increase heat transfer between the substrate holder 20 and the substrate W. This helps with controlling the temperature of the substrate W. As shown in FIG. 4, the gas is supplied through the gas supply passageway 38 directly under the electrostatic sheet 25. The gas supply passageway 38 terminates at an opening in the object-facing surface 37 of the core body 21 directly below the electrostatic sheet 25. The gas flows in the vertical gap 40 between the core body 21 and the electrostatic sheet 25 and reaches the radial gap 39. The gas then fills the gap between the substrate W and the top surface of the electrostatic sheet 25, thereby improving thermal conduction between the substrate W and the substrate holder 20.

Figure 5:
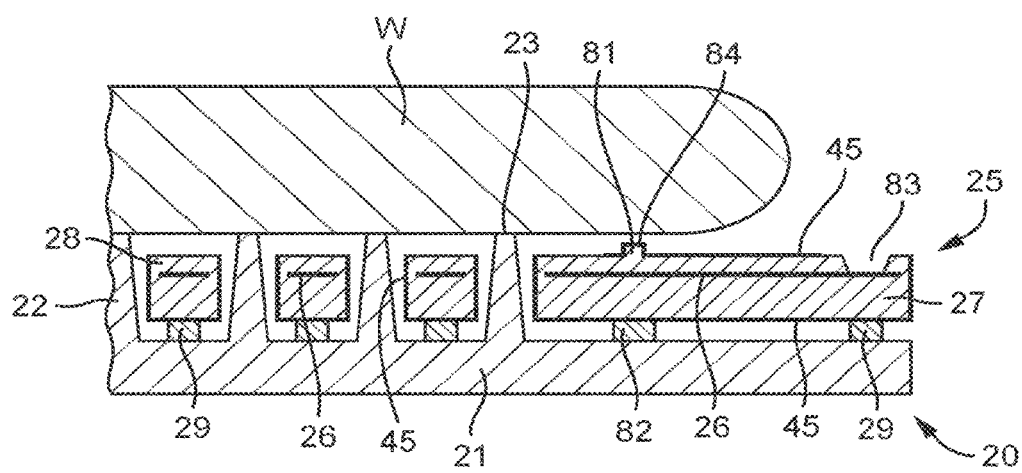
FIGS. 5 and 6 are cross-sectional views of alternative embodiments of an object holder according to the invention.

FIG. 5 is a cross-sectional view of part of a substrate holder 20 according to an embodiment of the invention. As shown in FIG. 5, in an embodiment the substrate holder 20 comprises a circumferential barrier 81, 82. The circumferential barrier 81, 82 is for reducing outflow of fluid escaping from a space between the electrostatic sheet 25 and the core body 21. As mentioned above, a gas may be supplied under the electrostatic sheet 25. The gas can flow under the electrostatic sheet 25 toward the substrate W and can be present in the gap between the substrate W and the electrostatic sheet 25. The circumferential barrier 81, 82 is configured to seal off the volume of gas that improves the thermal conduction between the core body 21 and the substrate W. The circumferential barrier 81, 82 is configured to help maintain the pressure of fluid between the substrate W and the substrate holder 20. The circumferential barrier 81, 82 is radially outwards of holes in the substrate holder 20 through which pins extend for controlled lowering of the substrate W onto the substrate holder 20. In an embodiment, the circumferential barrier 81, 82 is radially inwards of the edge of the substrate W on the substrate holder 20. An embodiment of the invention is expected to improve uniformity of thermal conduction between the substrate W and the substrate holder 20. An embodiment of the invention is expected to improve accuracy of control of the temperature of the substrate W during an exposure process.

The circumferential barrier 81, 82 forms a circumferential gas flow constriction. In an embodiment, the circumferential barrier 81, 82 does not completely seal off the volume of gas between the substrate W and the substrate holder 20. In an embodiment the circumferential barrier 81, 82 is configured to allow a leak of fluid (e.g. a gas such as hydrogen) from the space between the substrate W and the core body 21. By allowing some leak of fluid through the circumferential barrier 81, 82, the gas pressure below the substrate W can decrease more quickly. This allows the substrate W to be unclamped from the substrate holder 20 more quickly. This allows the substrate W to be exchanged for another substrate more quickly. An embodiment of the invention is expected to improve throughput.

As shown in FIG. 5, in an embodiment the circumferential barrier 82 is located between the electrostatic sheet 25 and the core body 21. In an embodiment, the circumferential barrier 82 between the electrostatic sheet 25 and the core body 21 is formed by a bonding material such as an adhesive material. For example, in an embodiment the material used to form the circumferential barrier 82 is the same as the bonding material 29 used to attach the electrostatic sheet 25 to the core body 21. The circumferential barrier 82 helps to maintain the connection between the electrostatic sheet 25 and the core body 21. An embodiment of the invention is expected to make the substrate holder 20 more robust.

In an embodiment, the circumferential barrier 82 between the electrostatic sheet 25 and the core body 21 extends all around the circumference. In an embodiment, the circumferential barrier 82 between the electrostatic sheet 25 and the core body 22 extends the full vertical gap between the electrostatic sheet 25 and the core body 21. In an embodiment, the circumferential barrier 82 between the electrostatic sheet 25 and the core body 21 allows substantially no gas to pass through it. In an alternative embodiment, the circumferential barrier 82 between the electrostatic sheet 25 and the core body 21 is configured to allow some gas to leak through it. In an embodiment, gas is allowed to leak out through a gap between the lower side of the substrate W and the upper side of the electrostatic sheet 25.

As shown in FIG. 5, in an embodiment a circumferential barrier 81 is provided at the upper side of the electrostatic sheet 25. As shown in FIG. 5, in an embodiment the circumferential barrier 81 is formed by the electrostatic sheet 25. The circumferential barrier 81 may be formed integrally as part of the electrostatic sheet 25. For example, in an embodiment the circumferential barrier 81 is formed as an integral part of the upper dielectric layer 28 of the electrostatic sheet 25. The circumferential barrier 81 is configured to extend fully around the circumference. As shown in FIG. 5, in an embodiment the circumferential barrier 81 is configured to protrude towards the substrate W to a height that is lower than the height to which the burls 22 protrude. As shown in FIG. 5, in an embodiment the circumferential barrier 81 is arranged such that a gap exists between the lower surface of the substrate W and the top 84 of the circumferential barrier 81. Gas can leak out through the small gap above the top 84 of the circumferential barrier 81. By providing the small gap, the circumferential barrier 81 does not directly contact the substrate W. The circumferential barrier 81 does not adversely affect the flatness of the substrate W.

Figure 26:
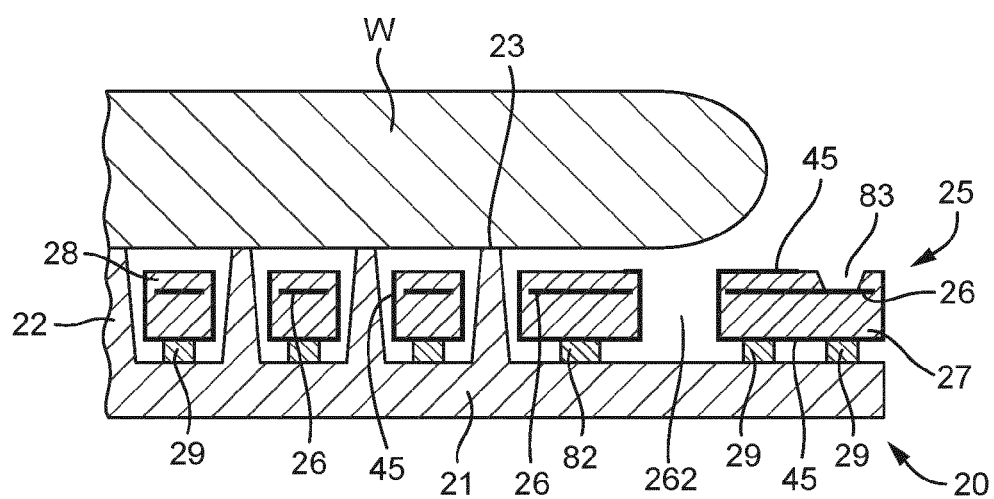
FIG. 26 is a cross-sectional views of an embodiment of an object holder according to the invention.

In any embodiment, the dimensions of the circumferential barrier 81 that forms a small gap (for gas leakage) are selected so as to control the flow rate of gas leaking out from the region between the substrate W and the core body 21. In an embodiment, the circumferential barrier 81 is configured such that the vertical gap between the top 84 of the circumferential barrier 81 and the lower surface of the substrate W (which corresponds to the vertical distance between the top 84 of the circumferential barrier 81 and the distal ends 23 of the burls 22) is more than 2 µm. As shown in FIG. 26, in an alternative embodiment the circumferential barrier 81 at the upper side of the electrostatic sheet 25 is not provided (although a circumferential barrier 82 is provided at the lower side of the electrostatic sheet 25). In an embodiment, the vertical gap is at least 3 µm and optionally at least 5 µm. By providing a larger vertical gap, there is a greater manufacturing tolerance for the vertical position of the circumferential barrier 81, while ensuring that the circumferential barrier 81 does not undesirably affect the flatness of the substrate W. An embodiment of the invention is expected to make it easier to manufacture the substrate holder 20. As mentioned above, the bonding material 29 is used to connect the electrostatic sheet 25 to the core body 21. By increasing the manufacturing tolerance, the bonding material 29 can be used without unduly decreasing the manufacturing yield. Use of a bonding material can decrease the accuracy with which the vertical position of the electrostatic sheet 25 can be determined. Additionally, if an adhesive is used, the adhesive can drift overtime, resulting in a vertical displacement of the order of about 0.1 µm. An embodiment of the invention is expected to allow adhesives to be used while maintaining manufacturing yield.

In an embodiment, the circumferential barrier 81 is configured to have a width (in the radial direction of the substrate holder 20) of greater than 0.5 mm. In an embodiment, the circumferential barrier 81 has a radial width of at least 0.6 mm, optionally at least 1 mm, for example 1.2 mm. By increasing the radial width of the circumferential barrier 81, the vertical gap to the substrate W can be increased (as explained above) without unduly increasing the flow rate of gas leaking out from the space between the substrate W and the substrate holder 20.

As shown in FIG. 5, in an embodiment bonding material 29 is used to bond the electrostatic sheet 25 to the core body 21 radially outwards of the circumferential barrier 82 between the electrostatic sheet 25 and the core body 21. In an embodiment, this radially outer bonding material 29 extends all around the circumference, similar to the circumferential barrier 82. In an alternative embodiment, the radially outer bonding material 29 is formed of discrete dots of bonding material, similar to the bonding material 29 between the central part of electrostatic sheet 25 and the core body 21.

As shown in FIG. 5, in an embodiment the electrostatic sheet 25 extends radially beyond the substrate W. As shown in FIG. 5, in an embodiment the substrate holder 20 comprises a gap 83 in one of the dielectric layers 27, 28. The gap 83 is to allow the electrode 26 to be connected to a power supply. For example, the electrode 26 may be connected to a high voltage power supply. In an embodiment, the electrode 26 is configured to be connected to an external power supply. As shown in FIG. 5, in an embodiment the gap 83 is radially outward of the circumferential barrier 81, 82. In the arrangement shown in FIG. 5, the gap 83 is provided in the upper dielectric layer 28. In an alternative embodiment, the gap 83 is provided in the lower dielectric layer 27.

The substrate holder 20 is designed to allow the electrode 26 to make an electrical connection to a power supply while sealing off the volume of gas between the substrate W and the substrate holder 20. As shown in FIG. 5, in an embodiment the electrode 26 passes underneath the circumferential barrier 81 that allows the leak of gas. In an embodiment, the electrostatic sheet 25 comprises electrostatic shielding 45. The electrostatic shielding 45 is formed of an electrically conductive material. In an embodiment the electrostatic shielding 45 is grounded. The electrostatic shielding 45 is configured to shield other components from the electrostatic sheet 2. In an embodiment the electrostatic shielding 45 is configured to shield the substrate W and/or from the rest of the core body 21 and burls 22 from charges in the dielectric layers 28, 27. The electrostatic shielding 45 may be provided in one or more different positions around the electrostatic sheet 25. As shown in FIG. 5, in an embodiment electrostatic shielding 45 is provided covering the top 84 of the circumferential barrier 81.

In an embodiment, the electrostatic shielding 45 comprises electrically conductive plating at the surface of the electrostatic sheet 25. In an embodiment, the electrostatic shielding 45 is applied by chemical vapour deposition. In an embodiment, the electrostatic shielding 45 is applied by sputtering.

In an embodiment, the electrostatic shielding 45 is applied by physical vapour deposition. In an embodiment the electrostatic shielding 45 has a thickness of at least 50 nm, optionally at least 100 nm, optionally at least 200 nm and optionally at least 500 nm. In an embodiment the electrostatic shielding 45 has a thickness of at most 1000 nm, optionally at most 500 nm, optionally at most 200 nm and optionally at most 100 nm. In an embodiment the thickness of the electrostatic shielding 45 may be different for different sections of the electrostatic shielding.

As shown in FIG. 5, in an embodiment electrostatic shielding 45 is provided covering the circumferential barrier 81. The electrostatic shielding 45 is configured to prevent electrical discharge in the gap between the top 84 of the circumferential barrier 81 and the substrate W. As shown in FIG. 5, in an embodiment electrostatic shielding 45 is provided at the upper surface of the electrostatic sheet 25 radially outward of the circumferential barrier. The electrostatic shielding 45 is configured to prevent electrical discharge between the electrode 26 at the gap 83 and the substrate W.

By providing the gap 83 in the dielectric layer 28 with the electrostatic sheet 25 extending radially beyond the substrate W, the connection between the electrode 26 and the power supply is relatively simple. Additionally, the core 21 is relatively easy to manufacture.

In an embodiment, the electrostatic sheet 25 is configured to extend at least 3 mm, optionally at least 5 mm, and optionally at least 10 mm radially beyond the radial extent of the substrate W. For example, in an embodiment the substrate W has a diameter of 300 mm. The electrostatic sheet 25 has a diameter of, for example, at least 306 mm, optionally at least 310 mm and optionally at least 320 mm. By providing an electrostatic sheet 25 that is bigger than the substrate W, the surfaces of the electrostatic sheet 25 can be used as space for providing, for example, fiducial markers.

FIG. 26 is a cross-sectional view of part of a substrate holder 20 according to an embodiment of the invention. Only differences from the embodiment shown in FIG. 5 are described below.

As shown in FIG. 26, in an embodiment the electrostatic sheet 25 is not provided with the circumferential barrier 81 at the substrate-facing side of the electrostatic sheet 25. The circumferential barrier 82 is provided at the core body-facing side of the electrostatic sheet 25.

As shown in FIG. 26, in an embodiment the electrostatic sheet 25 comprises at least one gas vent 262. The gas vent 262 extends through the electrostatic sheet 25 connecting the substrate-facing side to the core body-facing side. The gas vent 262 is configured to allow gas to flow between the substrate-facing side to the core body-facing side of the electrostatic sheet 25. The dimensions of the gas vent 262 are not particularly limited. In an embodiment the gas vent 262 extends further in the radial direction of the electrostatic sheet 25 than in the circumferential direction of the electrostatic sheet 25. In an embodiment the gas vent 262 extends further in the radial direction of the electrostatic sheet 25 than the holes 34 through which the burls 22 protrude.

In an embodiment a plurality of gas vents 262 are provided at different positions circumferentially around the electrostatic sheet 25. When the substrate holder 20 is holding a substrate W, the gas pressure under the central part of the substrate W is higher than the gas pressure under the edge of the substrate W. This is at least partly due to backfill gas being provided for increasing the thermal connection between the substrate holder 20 and the substrate W. Under the peripheral region of the substrate W, the gas pressure decreases in the direction towards the edge of the substrate W. The pressure gradient depends on factors such as the shape of the substrate W.

As shown in FIG. 26, in an embodiment the gas vent 262 has a radially inward edge that is radially inward of the edge of the substrate W. When gas flows from under the central part of the substrate W, the gas can flow through the gas vent 262 before reaching the edge of the substrate W. An embodiment of the invention is expected to reduce the dependency of the pressure gradient on the shape of the substrate W. An embodiment of the invention is expected to make it easier to control the pressure gradient of the backfill gas towards vacuum.

Figure 27:
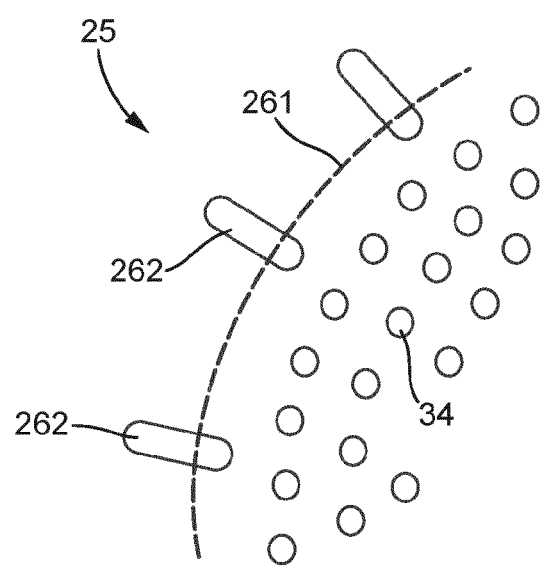
FIG. 27 is a plan view of part of the electrostatic sheet shown in FIG. 26.

FIG. 27 is a plan view of part of the electrostatic sheet 25 shown in FIG. 26. As shown in FIG. 27, the gas vent 262 is radially outward of the holes 34 for the burls 22. As shown in FIG. 27, in an embodiment the gas vent 262 extends across the edge 261 of the substrate W.

FIG. 6 is a cross-sectional view of part of a substrate holder 20 according to an embodiment of the invention. As shown in FIG. 6, in an embodiment the circumferential barrier 81 is formed by the core body 21. The circumferential barrier 81 may be formed integrally as part of the core body 21. The dimensions of the circumferential barrier 81 shown in FIG. 6 may be the same as the dimensions of the circumferential barrier 81 described above and shown in FIG. 5. Therefore, for conciseness those dimensions are not repeated here.

In an embodiment, the gap between the top 84 of the circumferential barrier 81 and the substrate W may be smaller compared to that shown in FIG. 5. For example, in an embodiment, the vertical gap between the top 84 and the substrate W is at most 10 μm, optionally at most 5 μm, and optionally at most 2 μm. By providing that the circumferential barrier 81 is formed by the core body 21, the vertical distance between the top 84 of the circumferential barrier 81 and the distal ends 23 of the burls 22 can be controlled more accurately. An embodiment of the invention is expected to achieve tighter manufacturing tolerances. When the vertical gap above the top 84 of the circumferential barrier 81 is smaller, the radial width of the circumferential barrier 81 may be smaller. This helps to maintain a relatively unchanged flow of gas through the gap above the circumferential barrier 81. For example, in an embodiment the radial width of the circumferential barrier 81 is at most 2 mm, optionally at most 1 mm, and optionally at most 0.5 mm.

As shown in FIG. 6, in an embodiment the substrate holder 20 comprises at least one connection line 91. The connection line 91 extends through the core body 21. The connection line 91 is for electrically connecting the electrode 26 to a power supply. In an embodiment, the connection line 91 is a high voltage connection line. In an embodiment, the connection line 91 is configured to connect to the electrode 26 to an external power supply. The power supply may be a high voltage power supply.

As shown in FIG. 6, in an embodiment the core body 21 comprises at least one connection line channel 93. The connection line channel 93 is configured to allow the connection line 91 to extend through the core body 21. In an embodiment the connection line 91 is an electrical conductor such as a wire. In an embodiment the wire has an insulating material around it so as to reduce the possibility of electrical breakdown between the connection line 91 and other components such as the core body 21.

As shown in FIG. 6, in an embodiment the connection line 91 is connected to the underside of the electrode 26. In an embodiment, an insulating material 92 is provided where the connection line 91 connects to the electrode 26. The insulating material 92 is configured to reduce the possibility of the connection line 91 contacting a vacuum (or near vacuum). In an embodiment, the connection line 91 is flexible. In an embodiment the connection line 91 is connected to the electrode 26 by an adhesive. The connection line 91 within the connection line channel 93 forms an electrical feed-through through the core body 21.

In an alternative embodiment, the connection line 91 forms an electrical lead through the core body 21 that is exposed in a location below the electrostatic sheet 25. A conductive epoxy may be used to mechanically and electrically connect the electrical lead to the electrode 26.

By providing that the circumferential barrier 81 is part of the core body 21, the gap above the circumferential barrier 81 is independent of the height of the electrostatic sheet 25. This means that the gap is independent of assembly tolerances and of, for example, bond material drift over time.

In an embodiment the electrostatic sheet 25 is completely round when viewed in plan view. An embodiment of the invention is expected to make it easier to manufacture the electrostatic sheet 25. An embodiment of the invention is expected to provide an electrostatic sheet with a more even distribution of stress.

Figure 7:
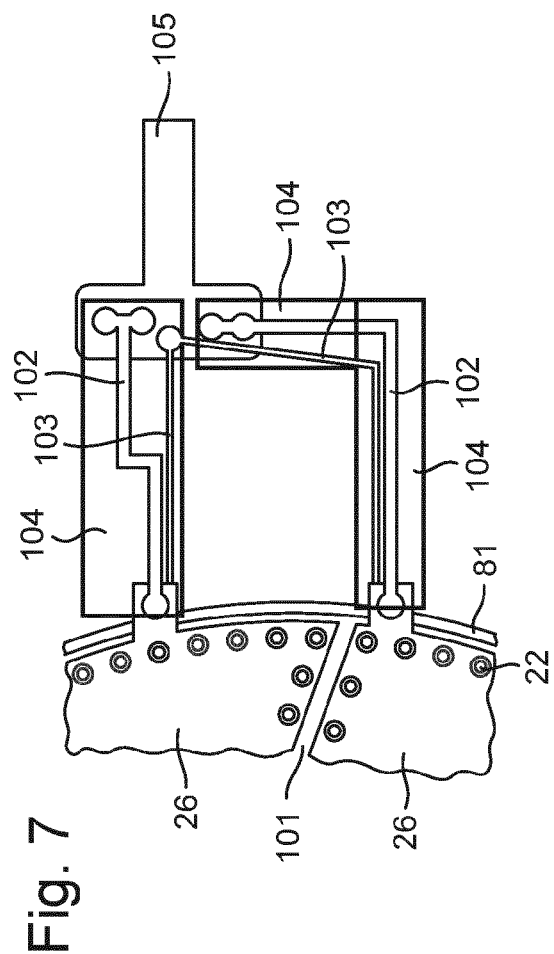
FIG. 7 is a plan view of a cross-section of an object holder according to an embodiment of the invention.

FIG. 7 is a plan view of a cross-section of part of a substrate holder 20 according to an alternative embodiment of the invention. FIG. 8 is a cross-sectional view of the substrate holder 20 shown in FIG. 7. FIG. 7 shows the circumferential barrier 81 and the electrode 26. As shown in FIG. 7, in an embodiment the electrode 26 extends through the circumferential barrier 81 to form a terminal to allow the electrode 26 to be connected to a power supply. In an embodiment, the power supply is external to the substrate holder 20. In an embodiment the power supply is a high voltage power supply.

As shown in FIG. 7, in an embodiment the electrostatic sheet 25 comprises a plurality of electrodes 26. For example, two electrodes 26 are shown in FIG. 7. In an embodiment the electrostatic sheet 25 comprises a barrier 101 that separates the electrodes 26. The barrier 101 is formed by an electrically insulating material so as to electrically isolate the electrodes 26 from each other. Each electrode 26 is individually connected to the power supply.

As shown in FIG. 8, in an embodiment the circumferential barrier 81 is formed on the core body 21. As shown in FIG. 8, the circumferential barrier 81 comprises one or more openings 107. The electrode 26 extends through the opening 107. As shown in FIG. 8, in an embodiment the electrostatic sheet 25 (including the dielectric layers 27, 28 and the electrode 26) extends through the opening 107 in the circumferential barrier 81. The electrode 26 passes through to the area outside of the circumferential barrier 81. The electrode 26 can connect electrically to a power supply radially outward of the circumferential barrier 81.

As shown in FIGS. 7 and 8, in an embodiment the electrical connection between the electrode 26 and the power supply comprises one or more intermediate plates 104. The intermediate plate 104 makes the connection more robust. In an embodiment, the intermediate plate 104 comprises an insulating base (e.g. a glass plate) with electrical feed lines mounted thereon. For example, as shown in FIG. 7, in an embodiment the intermediate plate 104 carries a high voltage trace 102 and a ground trace 103. The intermediate plate 104 is configured to electrically connect the terminal of the electrode 26 to a power supply connector 105. In an embodiment, the power supply connector 105 is flexible so that movements of the power supply are dampened before reaching the electrostatic sheet 25. In an embodiment the power supply connector 105 has a fixed position. An embodiment of the invention is expected to be backwards compatible with existing lithographic apparatuses. In an embodiment, the intermediate plates 104 reduce a force that may be exerted on the electrostatic sheet 25 of the substrate holder 20 by movements of the power supply connector 105. By providing the intermediate plate 104, the distance that the terminal of the electrode 26 extends beyond the circumferential barrier 81 can be reduced (or minimised). This makes the electrostatic sheet 25 easier to manufacture and makes the electrostatic sheet 25 more robust.

By providing that the electrode 26 extends through the opening 107 in the circumferential barrier 81, it is not necessary to manufacture any connection line channel within the core body 21. An embodiment of the invention is expected to make it easier to manufacture the core body 21.

As shown in FIG. 8, in an embodiment the circumferential barrier 81 is initially formed as a separate component from the core body 21. The circumferential barrier 81 is connected to the core body 21 by a glue sealing 108. As shown in FIG. 8, in an embodiment the intermediate plate 104 is connected to the core body 21 by a glue sealing 108. As shown in FIG. 8, in an embodiment the electrical connection between the electrode 26 and the intermediate plate 104 is insulated by a glue sealing 108 at the top side of the electrostatic sheet 25. As shown in FIG. 8, in an embodiment the electrical connection between the intermediate plate 104 and the power supply connector 105 is insulated electrically by a glue sealing 108 at the top side of the power supply connector 105.

As shown in FIG. 8, in an embodiment a conductive material 106 extends through the electrostatic sheet 25 so as to form the electrical connection between the electrode 26 and the high voltage trace 102 of the intermediate plate 104.

Figure 9:
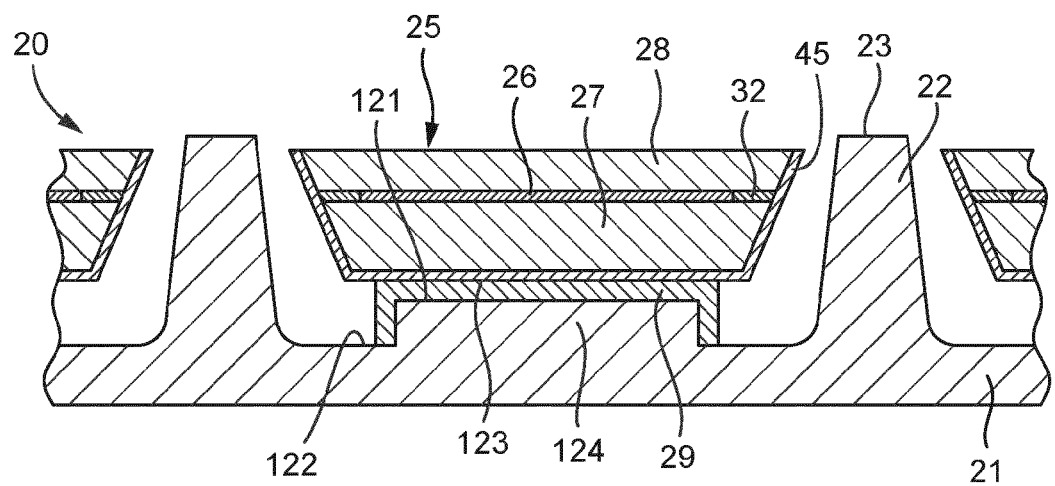
FIG. 9 is a close-up view of part of an object holder according to an embodiment of the invention.

FIG. 9 is a cross-sectional view of part of a substrate holder 20 according to an embodiment of the invention. As shown in FIG. 9, in an embodiment the electrostatic sheet 25 is bonded to the core body 21 by a bonding material 29. In an embodiment, a plurality of volumes of bonding material 29 across the top surface of the core body 21 connect the core body 21 to the electrostatic sheet 25. The bonding material 29 may be an adhesive, or a welding material, for example. The bonding material 29 is provided between the burls 22.

As shown in FIG. 9, in an embodiment the object-facing surface of the core body 21 between the burls 22, comprises an upper level 121 and a lower level 122. The upper level 121 is vertically higher (i.e. such that there is a smaller gap to the electrostatic sheet 25) than the lower level 122. As shown in FIG. 9, in an embodiment the bonding material 29 is provided on the upper level 121. The lower level 122 is adjacent to the upper level 121. As shown in FIG. 9, in an embodiment there is step change (i.e. a sudden discontinuous change in height) between the lower level 122 and the upper level 121. In an alternative embodiment the change in height between the lower level 122 and the upper level 121 may be more gradual. As shown in FIG. 9, in an embodiment the upper level 121 is vertically below the lower surface 123 of the electrostatic sheet 25. As shown in FIG. 9, in an embodiment at least some of the lower level 122 is vertically below the lower surface 123 of the electrostatic sheet 25. Some of the lower level 122 is not directly below the electrostatic sheet 25. For example, some of the lower level 122 immediately surrounds the burls 22, where the electrostatic sheet 25 may not be directly above that portion of the lower level 122. However, some of the lower level 122 is directly below the electrostatic sheet 25.

In an embodiment, the upper level 121 forms the upper surface of a bond pad 124. The bond pad 124 is a raised section of the core body 21 on which the bonding material 29 is disposed. The height of the upper level 121 at the upper surface of the bond pad 124 affects the diameter of the volume of bonding material 29. However, the height of the lower level 122 does not affect the height of the electrostatic sheet 25 of the substrate holder 20. The height of the electrostatic sheet 25 is affected by the amount of bonding material 29 between the electrostatic sheet 25 and the core body 21. The diameter of the volume of bonding material 29 depends on the amount of bonding material 29. By providing a larger gap between the lower level 122 and the electrostatic sheet 25 outside of the bond pad 124, the diameter of the volume of bonding material 29 is less sensitive to the amount of bonding material 29. The stiffness of the bond is less sensitive to the volume of bonding material 29. The stiffness and geometry of the volume of bonding material 29 can be controlled more accurately by controlling the geometry of the bond pad 124. An embodiment of the invention is expected to improve the consistency of the properties of the bonds between the electrostatic sheet 25 and the core body 21 across the substrate holder 20. A bond pad design is also used for the gas sealing glue ring around the perimeter of the clamp, and around the holes through which pins extend for controlled lowering of the substrate W onto the substrate holder 20.

Figure 10:
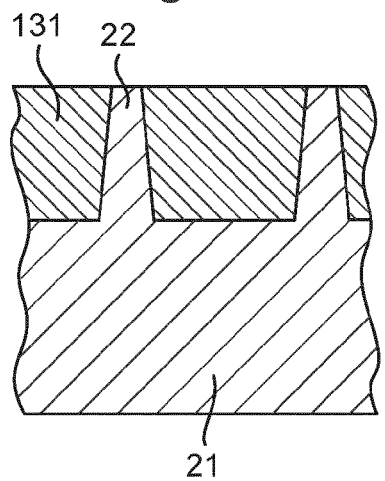
FIGS. 10 to 12 show different stages of part of a method of making an object holder according to an embodiment of the invention.
Figure 11:
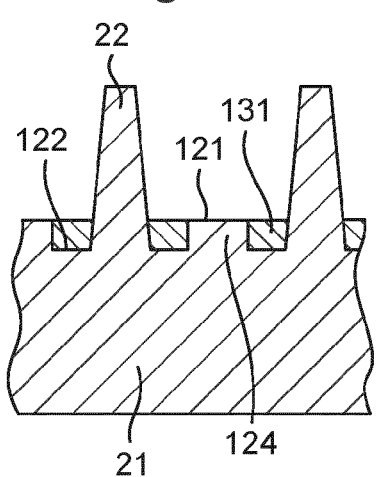
Figure 12:
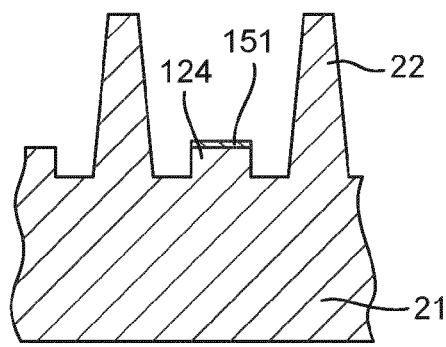
Figure 13:
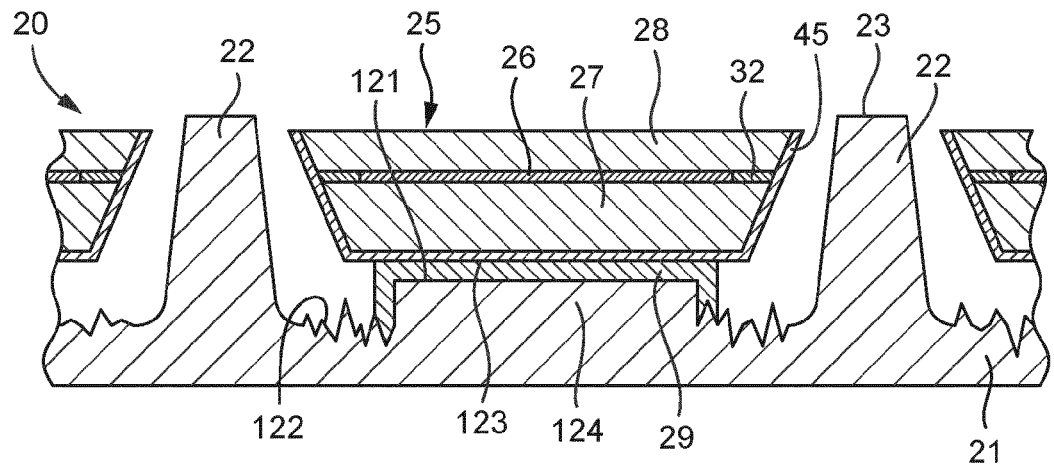
FIG. 13 is a close-up view of part of an object holder according to an embodiment of the invention.

FIGS. 10 to 12 schematically show different stages of a process of manufacturing a core body 21. FIG. 13 is a cross-sectional view of a substrate holder 20 once the electrostatic sheet 25 is connected to the core body 21. As shown in FIG. 13, in an embodiment the upper level 121 has a smoother surface than the lower level 122. The lower level 122 has a greater surface roughness compared to the top of the bond pad 124.

By providing the bond pad 124, the properties of the bond between the core body 21 and the electrostatic sheet 25 are controlled by controlling the properties of the bond pad 124. The properties of the bond are less sensitive to the properties of the surface of the core body 21 beyond the bond pads 124. An embodiment of the invention is expected to provide greater manufacturing freedom for some of the surface of the core body 21. In an embodiment, different manufacturing techniques are used for different steps of preparing the lower level 122 compared to the upper level 121.

As shown in FIG. 10, in an embodiment, the burls 22 are formed by removing material 131 from the upper surface of the core body 21. The material 131 may be removed in a step of coarse material removal. The coarse material removal step may have a large tolerance. This means that the surface between the burls may have a relatively large roughness immediately following the coarse material removal step.

As shown in FIG. 11, a method of making the core body 21 may comprise a subsequent step of removing further material 131 in a step of local coarse material removal. The local coarse material removal step results in the formation of the bond pads 124. The material 131 is removed where the lower level 122 is to be formed. The material 131 is not removed locally where the pad 124 is intended to be located. After the local coarse material removal step, the upper level 121 and the lower level 122 may have rough surfaces. In an embodiment, the coarse material removal steps are performed by laser ablation. However, other methods may be used.

As shown in FIG. 12, in an embodiment the method of making the core body 21 comprises a subsequent step of removing further material 151 from the tops of the bond pads 124. In an embodiment, the further material 151 is removed in a fine material removal step. The fine material removal step has a tighter tolerance compared to the coarse material removal steps. After the fine material removal step, the surface at the top of the bond pad 124 is smoother than the surface at the lower level 122 of the core body 21. A smoother surface improves the consistency of the properties of the bond between the electrostatic sheet 25 and the core body 21.

In an embodiment, the method of making the core body 21 comprises a step of polishing the distal ends 23 of the burls 22. In an embodiment, the fine material removal step is performed after the step of polishing the distal ends 23 of the burls 22. This means that the height of the upper level 121 at the glue pad 124 can be tightly controlled so that electrostatic sheet 25 has the desired vertical position. It may be that different burls 22 have different lengths (i.e. different vertical distances between the distal end 23 and the object-facing surface of the core body 21 between the burls 22). Lengths of the burls 22 may be different in order to ensure that all of the distal ends 23 are in a flat plane. The fine material removal step allows the height of the bond pads 124 to be adjusted so as to carefully control the vertical gap to be filled by the bonding material 29 between the electrostatic sheet 25 and the core body 21. Across the substrate holder 20, the lower level 122 may have different heights.

Figure 14:
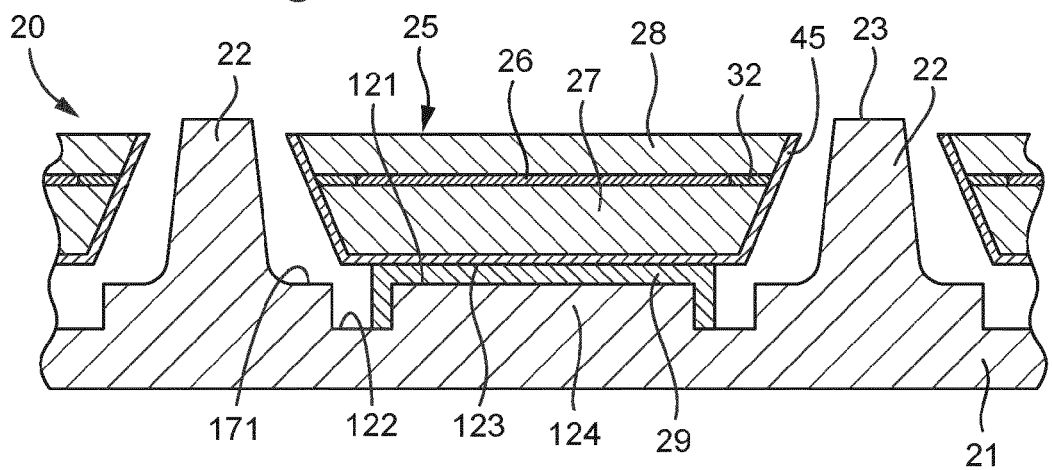
FIG. 14 is a close-up view of part of an object holder according to an embodiment of the invention.

FIG. 14 is a cross-sectional view of part of a substrate holder 20 according to an embodiment of the invention. As shown in FIG. 14, in an embodiment the object-facing surface of the core body 21 comprises a raised level 171. The raised level 171 surrounds the burls 22. The raised level 171 is raised relative to the lower level 122. In an embodiment the raised level 171 is at the same height as the upper level 121. However, this is not necessarily the case. In an alternative embodiment, the raised level 171 is higher than the upper level 121. In a further alternative embodiment, the raised level 171 is lower than the upper level 121. By providing the raised level 171 surrounding the burls 22, the burls 22 can be made more stiff (compared to if the raised level 171 was replaced by the lower level 122). The stiffness of the burls 22 can be controlled by controlling the height of the raised level 171. The lower level 122 between the raised level 171 and the upper level 121 reduces the sensitivity of the bonds between the electrostatic sheet 25 and the core body 21 to the amount of bonding material 29.

Figure 15:
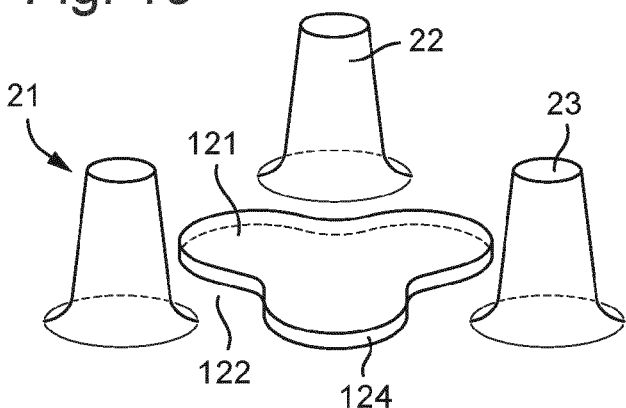
FIG. 15 is a close-up view of part of an object holder according to an embodiment of the invention.

FIG. 15 schematically shows the upper surface of the core body 21 between three burls 22. As shown in FIG. 15, in an embodiment the upper level 121 is non-circular. As can be seen from FIG. 15, by providing that the bond pad 124 is non-circular, the horizontal extent (i.e. shape in plan view) of the bonding material 29 between the burls 22 can be controlled. A larger area of bonding material 29 can be provided between the burls 22, without the bonding material reaching too close to the burls 22. An embodiment of the invention is expected to improve the strength of the connection between the electrostatic sheet 25 and the core body 21.

Figure 16:
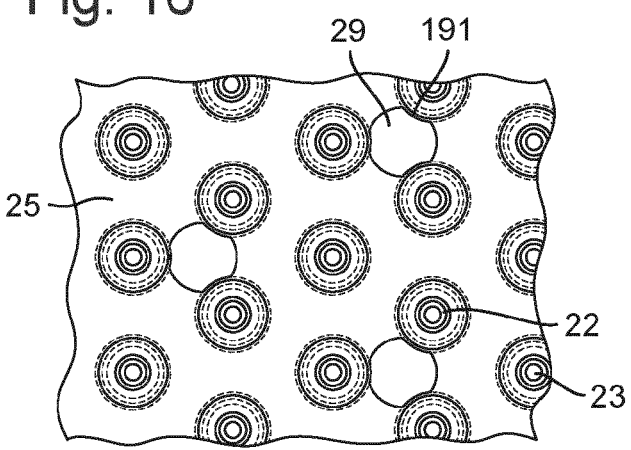
FIG. 16 is a plan view of part of an object holder according to an embodiment of the invention.

FIG. 16 shows a plan view of a substrate holder 20 according to an embodiment of the invention. In FIG. 16, the electrostatic sheet 25 is shown as transparent so that the bonding material 29 below the electrostatic sheet 25 is visible in FIG. 16. As shown in FIG. 16, in an embodiment the volumes of bonding material 29 have a non-circular shape in plan view. The shape of the bonding material corresponds to the shape of the bond pad 124. The bond pad 124 is non-circular. As shown in FIG. 16, in an embodiment the bond pad 124 and the bonding material 29 have concave edges 191 facing the burls 22. The size of the bond in the area between the burls is made larger without decreasing the distance between the bond and the burls 22.

In an embodiment, the height of the upper level 121 is configured such that the vertical gap between the bottom of the electrostatic sheet 25 and the upper level 121 is at least 5 μm, optionally at least 10 μm, optionally at least 20 μm, and optionally at least 50 μm. This provides sufficient manufacturing tolerance for there to be a gap to be filled by the bonding material 29. In an embodiment, the vertical gap between the electrostatic sheet 25 and the upper level 121 is at most 200 μm, optionally at most 100 μm, and optionally at most 50 μm. A smaller gap allows the properties of the bond formed by the bonding material 29 to be controlled more precisely. In an embodiment, the vertical gap between the electrostatic sheet 25 and the lower level 122 is at least 50 μm, optionally at least 100 μm, and optionally at least 200 μm. A larger gap reduces the sensitivity of the diameter of the bond formed by the bonding material 29 to the amount of bonding material used.

FIG. 17 is a cross-sectional view of an electrostatic sheet 25 according to an embodiment of the invention. As shown in FIG. 17, in an embodiment an electrically insulating bonding layer 32 is sandwiched between the dielectric layers 27, 28. By providing that the bonding layer 32 is electrically insulating, the bonding layer 32 is configured to electrically insulate the electrode 26. In an embodiment, the bonding layer 32 surrounds the electrode 26 in a plane of the electrode 26. The bonding layer 32 electrically insulates the electrode 26. The bonding layer 32 electrically isolates the electrode 32 from the holes 34 through which the burls 22 protrude. The bonding layer 32 is configured to bond the dielectric layers 27, 28 to each other.

In an embodiment, the bonding layer 32 is deposited in a moldable state. The bonding layer 32 is stable once bonded. In an embodiment, the electrically insulating bonding layer 32 comprises an adhesive. In an embodiment, the bonding layer 32 comprises a polymer. In an embodiment, the bonding layer 32 comprises an organic polymer. In an embodiment, the bonding layer 32 comprises benzocyclobutene, BCB. Other materials may be used for the bonding layer 32, such as Parylene.

In an embodiment, the upper dielectric layer 28 comprises a glass. In an embodiment, the upper dielectric layer 28 comprises an oxide. In an embodiment, the glass is a borosilicate glass, such as Corning® Eagle XG® for example. In an alternative embodiment, the upper dielectric layer 28 comprises a titania-silicate glass, such as ULE® for example.

In an embodiment, the lower dielectric layer 27 comprises the same material as the upper dielectric layer 28. In an alternative embodiment, the lower dielectric layer 27 is formed of a different material from the upper dielectric layer 28. For example, in an embodiment, the lower dielectric layer 27 is formed of a material that has a lower resistivity compared to the material used for the upper dielectric layer 28. In an embodiment, the lower dielectric layer 27 comprises a borosilicate glass, such as BOROFLOAT® 33 or another dielectric material.

FIGS. 18 and 19 schematically depict different stages of a method of making the electrostatic sheet 25. As shown in FIG. 18, in an embodiment the method comprises providing the upper dielectric layer 28 and the lower dielectric layer 27. As shown in the upper part of FIG. 18, in an embodiment the method comprises applying an electrode 26 to the upper dielectric layer 28. By providing that the electrode 26 is applied to the upper dielectric layer 28, the electrode 26 is closer to the top of the electrostatic sheet 25. As shown in FIG. 18, in an embodiment the bonding layer 32 is provided on only one of two major surfaces of the electrode 26. The electrode 26 is applied directly on to the dielectric layer 28. The bonding layer 32 is not between the electrode 26 and the top of the electrostatic sheet 25. This allows greater control of the electrical field strength above the electrostatic sheet 25 generated by the electrode 26. Although FIG. 18 shows the electrode 26 being applied to the upper dielectric layer 28, in an alternative embodiment the electrode 26 is applied to the lower dielectric layer 27.

As shown in FIG. 18, in an embodiment the method comprises applying the electrically insulating bonding layer 32 to the lower dielectric layer 27. The electrically insulating bonding layer 32 is applied before the dielectric layers 27, 28 are bonded to each other. In an embodiment, the bonding layer 32 is applied to the dielectric layer 27 by a spin coating process. However, other processes may be used.

In the arrangement shown in FIG. 18, the bonding layer 32 is applied to the lower dielectric layer 27. In an alternative embodiment, the bonding layer 32 is applied to the upper dielectric layer 28. As shown in FIG. 18, in an embodiment the electrode 26 and the bonding layer 32 are applied to different dielectric layers 27, 28. In an alternative embodiment (e.g. as described below and shown in FIGS. 20-25), both the electrode 26 and the bonding layer 32 are applied to the same dielectric layer (which may be either the lower dielectric layer 27 or the upper dielectric layer 28).

As shown in FIG. 18, in an embodiment the method of making the electrostatic sheet 25 comprises patterning the electrode 26 before the dielectric layers 27, 28 are bonded to each other. In an embodiment, the electrode 26 comprises a metal, such as chromium. In an embodiment, the electrode 26 has a thickness of at least 29 nm, optionally at least 50 nm, and optionally at least 100 nm. In an embodiment, the electrode 26 has a thickness of at most 500 nm, optionally at most 200 nm, and optionally at most 100 nm. In an embodiment, the electrode 26 is patterned by an etching process. In an alternative embodiment the electrode 26 is patterned by a lift-off process.

In an embodiment, the dielectric layer 28 to which the electrode 26 is applied has a thickness of at least 100 μm, optionally at least 200 μm, and optionally at least 500 μm. A thicker dielectric layer 28 is more robust for handling during the method of making the electrostatic sheet 25. In an embodiment, the dielectric layer 28 to which the electrode 26 is applied has a thickness of at most 2 mm, optionally at most 1 mm, and optionally 500 μm. The thinner dielectric layer 28 reduces the amount of thinning that may be required after the dielectric layers 27, 28 have been bonded together. The thickness of the dielectric layer 27 to which the bonding layer 32 is applied may be selected in the same manner as the thickness for the dielectric layer 28 to which the electrode 26 is applied. Therefore, the possible thicknesses are not repeated here.

As shown in FIG. 19, in an embodiment the method of making the electrostatic sheet 25 comprises bonding the upper dielectric layer 28 to the lower dielectric layer 27. The dielectric layers 27, 28 are joined together. In an embodiment, the method comprises heating the joined dielectric layers 27, 28, for example so as to polymerise the bonding layer 32. For example, the joined dielectric layers 27, 28 may be heated at a temperature of 250° C., although the temperature used is not particularly limited. The bonding layer 32 forms a bond between the upper dielectric layer 28 and the lower dielectric layer 27.

In an embodiment, the method of making the electrostatic sheet 25 comprises thinning the upper dielectric layer 28 and/or the lower dielectric layer 27. For example, in an embodiment the upper dielectric layer of the completed electrostatic sheet 25 has a thickness of at most 200 μm, and optionally at most 100 μm. In an embodiment, the lower dielectric layer 27 in the completed electrostatic sheet 25 has a thickness of at most 500 μm, and optionally at most 400 μm. In an embodiment, the dielectric layers 27, 28 are thinned after they have been bonded together. The dielectric layers 27, 28 may be thicker during the bonding steps so that they are more robust, and then thinned down once the risk of breakage is reduced. In an alternative embodiment, the dielectric layers 27, 28 are thinned to their desired thickness before being bonded together. In an embodiment, the dielectric layers 27, 28 are thinned by a grinding process and/or a polishing process.

Contaminating particles can be contacted to the surfaces of the components during manufacture of the electrostatic sheet 25. Contaminant particles between the dielectric layers 27, 28 become surrounded by the moldable bonding layer 32 when the dielectric layers 27, 28 are brought into contact with each other. Hence, the presence of the contaminant particles may not adversely affect the manufacture of the electrostatic sheet 25. An embodiment of the invention is expected to provide a method of making the electrostatic sheet 25 that is less sensitive to particles.

By providing the electrically insulating bonding layer 32, the bonding layer 32 performs the functions of both electrical insulation and mechanical/chemical bonding. An embodiment of the invention is expected to simplify the process of manufacturing the electrostatic sheet 25. It is not necessary to provide separate materials or processes to perform the functions of electrical insulation and bonding.

Figure 20:
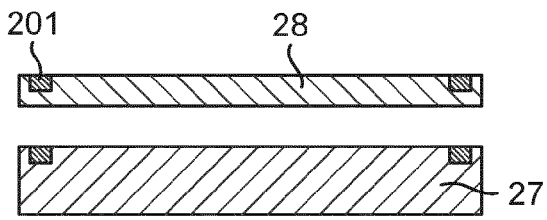
FIGS. 20 to 25 schematically show different stages of a method of making an electrostatic sheet according to an embodiment of the invention.

FIGS. 20 to 25 schematically depict different stages of a method of making an electrostatic sheet 25 according to an embodiment of the invention. As shown in FIG. 20, in an embodiment the method comprises providing the upper dielectric layer 28 and the lower dielectric layer 27. In an embodiment one or both of the dielectric layers 27, 28 are provided with one or more alignment markers 201. The alignment marker 201 makes it easier to align the dielectric layers 27, 28 relative to each other.

Figure 21:
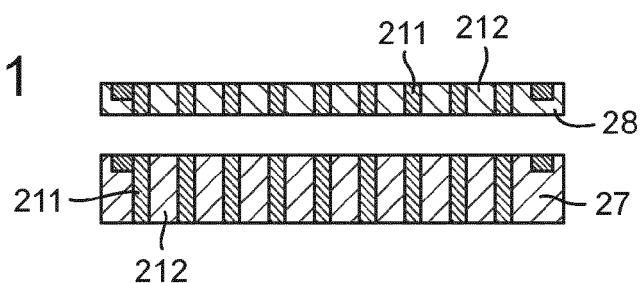

As shown in FIG. 21, in an embodiment the method comprises selectively irradiating the dielectric layers 27, 28 before the dielectric layers 27, 28 are bonded to each other. In an embodiment, the dielectric layers 27, 28 are irradiated based on desired positions of holes 34 for accommodating the burls 22 of the core body 21 of the substrate holder 20. In an embodiment, the dielectric layers 27, 28 are irradiated by applying a laser as preparation for etching (such as selected laser etching). As shown in FIG. 21, the irradiation of the dielectric layers 27, 28 results in irradiated regions 211 and non-irradiated regions 212. In an embodiment, the irradiated regions 211 correspond to the desired positions for the holes 34 for accommodating the burls 22. In an alternative embodiment, the non-irradiated regions 212 correspond to the desired positions of the holes 34 for the burls 22.

Figure 22:
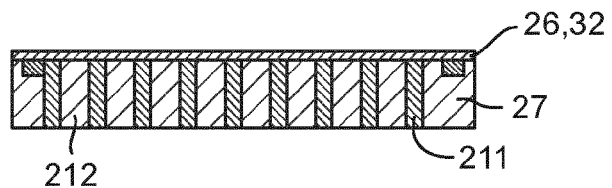
Figure 23:
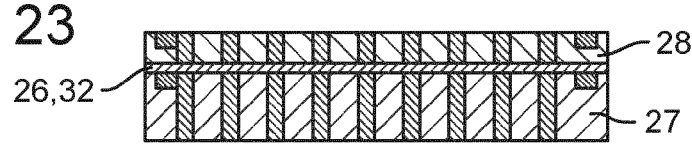

As shown in FIG. 22, in an embodiment, the method of making the electrostatic sheet 25 comprises applying the electrode 26 to one of the dielectric layers 27. In an embodiment, a thin electrical structure is applied to form the electrode 26. In an embodiment, a bonding layer 32 is applied onto the thin electrical structure. The bonding layer 32 protects the electrical structure. In an embodiment, the bonding layer 32 comprises an organic polymer. In an embodiment, the bonding layer 32 comprises BCB, or Parylene. As shown in FIG. 23, in an embodiment the upper dielectric layer 28 is bonded to the lower dielectric layer 27. The bonding layer 32 helps to bond the dielectric layers 27, 28 to each other.

Figure 24:
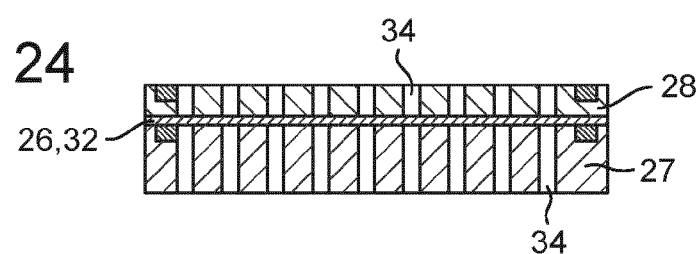

As shown in FIG. 24, in an embodiment the method comprises applying an etching step to form the holes 34 that are to accommodate the burls 22 of the core body 21. In an embodiment, material is removed to form the holes 34 after the dielectric layers 27, 28 are bonded to each other. The material is removed based on the selected irradiation. In an embodiment, the step of removing material comprises selectively etching irradiated portions 211 of the dielectric layers, for example by applying a laser.

Figure 25:
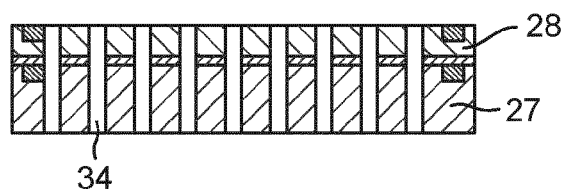

As shown in FIG. 25, in an embodiment the method comprises exposing the electrostatic sheet 25 to an oxide plasma that removes exposed portions of the bonding layer 32. In particular, after the step of etching away the irradiated portions 121 of the dielectric layers 27, 28, sections of the bonding layer 32 within the holes 34 are exposed. The stack is put in an oxide plasma to etch the material of the bonding layer 32 from the holes 34.

Figure 28A:
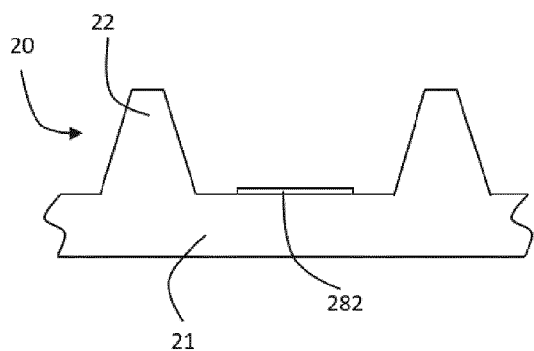
FIG. 28a-f schematically show different stages of a method of making an e object holder according to an embodiment of the invention.

FIGS. 28a-f schematically depict different stages of a method of making an substrate holder 20 according to an embodiment of the invention. The substrate holder 20 is similar to the one in the previous embodiments depicted in FIGS. 2-27, the bonding material 29 comprises a solder 286 or a welding material 286 which has a beneficial thermal conductivity. The solder 286 may be metal-based. Furthermore, the solder 286 or the welding material 286 may be less prone to creep or deformation upon ambient-to-vacuum transition, so it may provide better uniformity and stability of clamping force compared to glue or epoxy-bonding. Optionally adhesive layers 282, 284, such as platinum (Pt) or chromium (Cr) may be used to promote adhesion between the solder 286 and the core body 21 and/or the electrostatic sheet 25. This would preclude the need for flux in soldering, which would be beneficial for compatibility to H-radicals and/or H-plasma in scanner environment. The adhesive layers 282, 284 can be metal-based adhesive layers. The electrostatic sheet 25 is similar to the one in the previous embodiments depicted in FIGS. 2-27, As shown in FIG. 28a, in an embodiment the method comprises coating the adhesive layer 282 on a surface of the core body 21 facing the electrostatic sheet 25. The surface is between the burls 22.

Figure 28B:
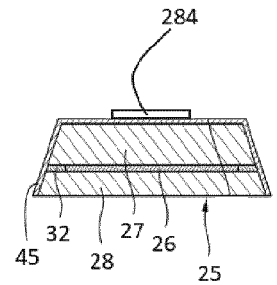

As shown in FIG. 28b, in an embodiment the method further comprises coating the adhesive layer 284 on a surface of the electrostatic sheet 25 facing the core body 21. Alternatively the electrostatic shielding 45 may serve as the adhesive layer 284 as the electrostatic shielding 45 may comprise Pt or/and Cr.

Figure 28C:
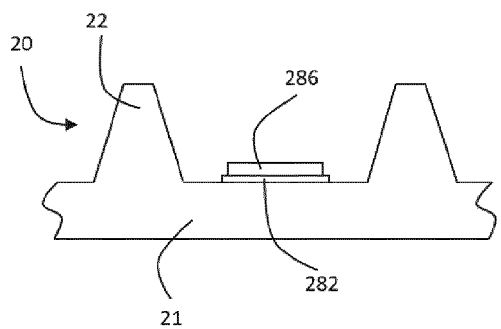

As shown in FIG. 28c, in an embodiment the method further comprises placing the solder 286 or the welding material 286 on the adhesive layer 284.

Figure 28D:
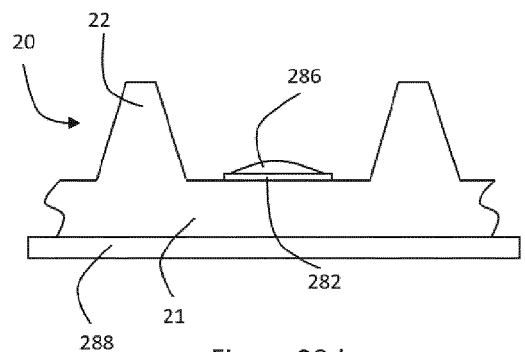

As shown in FIG. 28d, in an embodiment the method further comprises heating the solder 286 or the welding material 286. This can be done using a hot plate 288. The heat may be transferred from the hot plate 288 via the core body 21 to the solder 286 or the welding material 286.

Figure 28E:
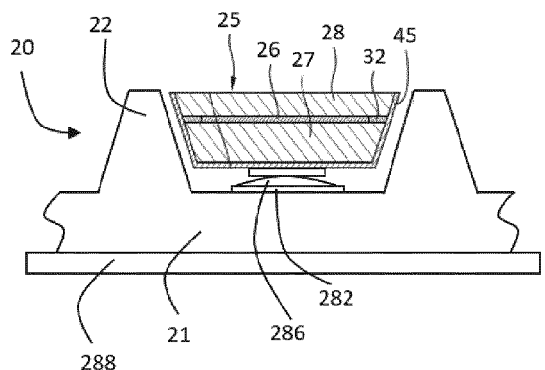

As shown in FIG. 28e, in an embodiment the method further comprises placing the electrostatic sheet 25 on the solder 286 or the welding material 286 while the solder 286 or the welding material 286 is being heated. The placing may comprise levelling the electrostatic sheet 25. The electrostatic sheet 25 may be flipped so that the adhesive layer 284 faces the core body 21.

Figure 28F:
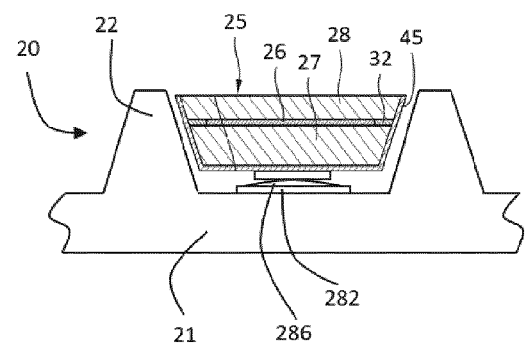

As shown in FIG. 28f, in an embodiment the method further comprises cooling the substrate holder 20 such that the electrostatic sheet 25 is soldered or welded on the core body 21.

The solder 286 may be a relatively low-temperature solder may be applied to minimize stress-induced deformations. Optionally metals which are prone to hydrogen embrittlement are not preferred. Possible candidates for the solder 286 are listed below:

| Alloy | Liquidus (° C.) | Solidus (° C.) | Suggested tensile Strength |
|---|---|---|---|
| 86.9Sn10In3.10Ag | 205 | 204 | 10,400 psi (71 MPa) |
| 91.8Sn4.8Bi3.4Ag | 213 | 211 | 11,770 psi (81 MPa) |
| 96.5Sn3Ag.5Cu | 220 | 217 | 5,740 psi (40 MPa) |
| 57Bi42Sn1Ag | 140 | 139 | 10,600 psi (73 MPa) |
| 52In48Sn | | 118E | 3,100 psi (21 MPa) |
| 97In3Ag | | 143E | 1,200 psi (8.2 MPa) |

The materials used to make all of the parts of an object holder according to embodiments may be any of the known materials used to manufacture known object holders. In particular, parts of the object holder according to embodiments may be manufactured with materials as disclosed in WO2015/120923A1, WO2014/154428A2 and US2013/0094009A1, the entire contents of which are incorporated herein by reference.

In particular, the metal used for the electrodes 26 may be Cr or Ti. The metal used on the distal end surfaces of the burls may be CrN or TiN. The insulating parts may be chrome oxide. The core body may be SiSiC. The material used for the electrostatic shielding 45 may be Cr, CrN or W (although many other materials are possible).

To aid clear explanation, embodiments have been described with reference to upper and lower surfaces of an object holder. The upper and lower surfaces are first and second surfaces of the object holder. The first surface is a surface to which an object may be clamped to. The second surface is a surface that a table may be clamped to. When the object holder is orientated in a horizontal plane, the first surface is an upper surface and the second surface is a lower surface. However, embodiments also include the object holder not being orientated in a horizontal plane.

Embodiments include the object holder being used in any lithographic apparatus. The lithographic apparatus may include any apparatus used in substrate manufacture, testing and inspection, such as an electron-beam inspection apparatus. To aid clear explanation, features of the object holder have been described primarily in the context of the upper side of a substrate holder 20 clamping to a substrate W. The features of the invention are equally applicable to the lower side of the object holder, for example the lower surface of a substrate holder 20 clamping to the rest of the substrate table WT. Merely as example, the features relating to the upper level 121, lower level 122 and bond pad 124 may be applied at the lower side of a substrate holder 20.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Although specific reference may have been made above to the use of embodiments of the invention in the context of object inspection and optical lithography, it will be appreciated that the invention, where the context allows, is not limited to these contexts and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

Clauses:

1. An object holder configured to support an object, the object holder comprising: a core body comprising a plurality of burls having distal ends in a support plane for supporting the object; an electrostatic sheet between the burls, the electrostatic sheet comprising an electrode sandwiched between dielectric layers; and a circumferential barrier for reducing outflow of gas escaping from a space between the electrostatic sheet and the core body.

2. The object holder of clause 1, wherein the circumferential barrier is located between the electrostatic sheet and the core body.

3. The object holder of clause 1 or 2, wherein the circumferential barrier is formed by the electrostatic sheet.

4. The object holder of clause 2 or 3, comprising: a gap in one of the dielectric layers to allow the electrode to be connected to a power supply, wherein the gap is radially outward of the circumferential barrier.

5. The object holder of any preceding clause, wherein the electrostatic sheet comprises at least one gas vent radially outward of the burls configured to allow gas to flow through the electrostatic sheet.

6. The object holder of clause 5, wherein the gas vent has a radially inner edge that is radially inward of an edge of the object.

7. The object holder of clause 1, wherein the circumferential barrier is formed by the core body.

8. The object holder of clause 7, wherein: the electrode extends through the circumferential barrier to form a terminal to allow the electrode to be connected to a power supply.

9. The object holder of any preceding clause, comprising: a high voltage connection line extending through the core body for connecting the electrode to a power supply.

10. The object holder of any preceding clause, wherein the electrostatic sheet is bonded to the core body by a bonding material.

11. The object holder of clause 10, wherein an object-facing surface of the core body between the burls comprises: an upper level on which the bonding material is provided; and a lower level adjacent to the upper level and vertically below a lower surface of the electrostatic sheet.

12. The object holder of clause 11, wherein the upper level has a smoother surface than the lower level.

13. The object holder of any of clauses 11-12, wherein the object-facing surface of the core body comprises: a raised level surrounding the burls, wherein the raised level is raised relative to the lower level.

14. The object holder of any of clauses 11-13, wherein the upper level is non-circular.

15. The object holder of any preceding clause, wherein an electrically insulating bonding layer is sandwiched between dielectric layers or/and wherein the object holder comprises a plurality of temperature sensors for sensing a temperature at multiple places of the object holder.

16. The object holder of clause 15, wherein the bonding layer comprises a polymer.

17. The object holder of any of clauses 15-16, wherein the bonding layer comprises benzocyclobutene.

18. The object holder of any of clauses 15-17, wherein the bonding layer surrounds the electrode in a plane of the electrode so as to electrically insulate the electrode.

19. The object holder of any of clauses 15-18, wherein the bonding layer is provided on only one of two major surfaces of the electrode.

20. An electrostatic sheet for an object holder configured to support an object, the electrostatic sheet comprising: holes for accommodating burls of a core body for supporting the object; dielectric layers; and an electrode sandwiched between dielectric layers; wherein the electrostatic sheet further comprises a circumferential barrier for reducing outflow of gas escaping from a space between the electrostatic sheet and the core body.

21. A method for making an electrostatic sheet for an object holder configured to support an object, the method comprising: applying an electrode to a dielectric layer; and bonding the dielectric layer to another dielectric layer so as to sandwich the electrode between the dielectric layers; wherein the electrostatic sheet comprises a circumferential barrier for reducing outflow of gas escaping from a space between the electrostatic sheet and the object.

22. The method of clause 21, comprising: patterning the electrode before the dielectric layers are bonded to each other.

23. The method of any of clauses 21-22, wherein an electrically insulating bonding layer is applied to said other dielectric layer before the dielectric layers are bonded to each other.

24. The method of any of clauses 21-23, comprising: selectively irradiating the dielectric layers before the dielectric layers are bonded to each other, based on desired positions of holes for accommodating burls of a core body of the object holder; and removing material to form the holes after the dielectric layers are bonded to each other, based on the selective irradiation.

25. The method of clause 24, wherein the step of removing material comprises selectively etching irradiated portions of the dielectric layers.

26. The method of clause 25, wherein the step of selectively etching irradiated portions of the dielectric layers is performed by applying a laser.

27. The method of any of clauses 24-26, wherein the step of removing material comprises exposing the electrostatic sheet to an oxide plasma that removes exposed portions of the bonding layer.

28. A lithographic apparatus comprising the object holder according to any of clauses 1-19.

29. A lithographic apparatus comprising the electrostatic sheet according clause 20.

The invention claimed is:

1. An object holder configured to support an object, the object holder comprising:
   a core body comprising a plurality of burls having distal ends in a support plane for supporting the object;
   an electrostatic sheet between the burls, the electrostatic sheet comprising an electrode sandwiched between dielectric layers; and
   a circumferential barrier for reducing outflow of gas escaping from a space between the electrostatic sheet and the core body.

2. The object holder of claim 1, wherein the circumferential barrier is located between the electrostatic sheet and the core body.

3. The object holder of claim 1, wherein the circumferential barrier is formed by the electrostatic sheet.

4. The object holder of claim 1, comprising:
   a gap in one of the dielectric layers to allow the electrode to be connected to a power supply, wherein the gap is radially outward of the circumferential barrier.

5. The object holder of claim 1, wherein the electrostatic sheet comprises at least one gas vent radially outward of the burls configured to allow gas to flow through the electrostatic sheet.

6. The object holder of claim 5, wherein the gas vent has a radially inner edge that is radially inward of an edge of the object.

7. The object holder of claim 1, wherein the circumferential barrier is formed by the core body, wherein: the electrode extends through the circumferential barrier to form a terminal to allow the electrode to be connected to a power supply.

8. The object holder of claim 1, wherein the electrostatic sheet is bonded to the core body by a bonding material, wherein an object-facing surface of the core body between the burls comprises:
    an upper level on which the bonding material is provided; and
    a lower level adjacent to the upper level and vertically below a lower surface of the electrostatic sheet.

9. The object holder of claim 8, wherein the object-facing surface of the core body comprises: a raised level surrounding the burls, wherein the raised level is raised relative to the lower level.

10. The object holder of claim 1, wherein an electrically insulating bonding layer is sandwiched between the dielectric layers or/and wherein the object holder comprises a plurality of temperature sensors for sensing a temperature at multiple places of the object holder.

11. The object holder of claim 10, wherein the bonding layer comprises benzocyclobutene or solder.

12. The object holder of claim 10, wherein the bonding layer surrounds the electrode in a plane of the electrode so as to electrically insulate the electrode.

13. An electrostatic sheet for an object holder configured to support an object, the electrostatic sheet comprising:
    holes for accommodating burls of a core body for supporting the object;
    dielectric layers; and
    an electrode sandwiched between dielectric layers;
    wherein the electrostatic sheet further comprises a circumferential barrier for reducing outflow of gas escaping from a space between the electrostatic sheet and the core body.

14. A method for making an electrostatic sheet for an object holder configured to support an object, the method comprising:
    applying an electrode to a dielectric layer;
    bonding the dielectric layer to another dielectric layer so as to sandwich the electrode between the dielectric layers, wherein the electrostatic sheet comprises a circumferential barrier for reducing outflow of gas escaping from a space between the electrostatic sheet and the object;
    selectively irradiating the dielectric layers, based on desired positions of holes for accommodating burls of a core body of the object holder, the selectively irradiating occurring before the dielectric layers are bonded to each other; and
    removing material based on the selective irradiation to form the holes after the dielectric layers are bonded to each other, the removing material comprising selectively etching irradiated portions of the dielectric layers.

* * * * *